(12) United States Patent
Campbell et al.

(10) Patent No.: US 8,564,952 B2
(45) Date of Patent: Oct. 22, 2013

(54) FLOW BOILING HEAT SINK STRUCTURE WITH VAPOR VENTING AND CONDENSING

(75) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madusudan K. Iyengar, Woodstock, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 13/189,596

(22) Filed: Jul. 25, 2011

(65) Prior Publication Data

US 2013/0027883 A1    Jan. 31, 2013

(51) Int. Cl.
 *H05K 7/20*    (2006.01)
(52) U.S. Cl.
 USPC ........... 361/700; 361/689; 361/699; 361/701; 361/702; 361/703; 165/80.4; 257/715
(58) Field of Classification Search
 None
 See application file for complete search history.

(56) References Cited

U.S. PATENT DOCUMENTS

| | | | |
|---|---|---|---|
| 4,635,709 A | 1/1987 | Altoz | |
| 5,604,665 A | 2/1997 | Chrysler et al. | |
| 6,550,530 B1 | 4/2003 | Bilski | |
| 6,942,018 B2 | 9/2005 | Goodson et al. | |
| 6,994,151 B2 | 2/2006 | Zhou et al. | |
| 7,019,971 B2 * | 3/2006 | Houle et al. | 361/699 |
| 7,188,622 B2 | 3/2007 | Martin et al. | |
| 7,265,979 B2 * | 9/2007 | Erturk et al. | 361/702 |
| 7,450,386 B2 * | 11/2008 | Silverstein et al. | 361/700 |
| 7,470,403 B2 | 12/2008 | Beebe et al. | |
| 7,477,517 B2 * | 1/2009 | Khanna et al. | 361/704 |
| 7,602,608 B2 * | 10/2009 | Tilton et al. | 361/699 |
| 7,686,071 B2 * | 3/2010 | Silverstein | 165/110 |

(Continued)

FOREIGN PATENT DOCUMENTS

CN    101307996 A    11/2008

OTHER PUBLICATIONS

David et al., "Vapor-Venting, Micromachined Heat Exchanger for Electronics Cooling", Proceedings of IMECE 2007, IMECE2007-42553 (Nov. 2007).

(Continued)

*Primary Examiner* — Boris Chervinsky
(74) *Attorney, Agent, or Firm* — Dennis Jung, Esq.; Kevin P. Radigan, Esq.; Heslin Rothenberg Farley & Mesiti P.C.

(57) ABSTRACT

A heat sink, and cooled electronic structure and cooled electronic apparatus utilizing the heat sink, are provided. The heat sink is fabricated of a thermally conductive structure which includes one or more coolant-carrying channels and one or more vapor-condensing channels. A membrane is disposed between the coolant-carrying channel(s) and the vapor-condensing channel(s). The membrane includes at least one vapor-permeable region, at least a portion of which overlies a portion of the coolant-carrying channel(s) and facilitates removal of vapor from the coolant-carrying channel(s) to the vapor-condensing channel(s). The heat sink further includes one or more coolant inlets coupled to provide a first liquid coolant flow to the coolant-carrying channel(s), and a second liquid coolant flow to condense vapor within the vapor-condensing channel(s).

19 Claims, 32 Drawing Sheets

(56) References Cited

U.S. PATENT DOCUMENTS

| | | | |
|---|---|---|---|
| 7,796,389 B2* | 9/2010 | Edmunds et al. | 361/700 |
| 7,888,603 B2 | 2/2011 | Lu et al. | |
| 8,188,595 B2* | 5/2012 | Shuja | 257/714 |
| 2006/0032622 A1 | 2/2006 | Yen et al. | |
| 2008/0066889 A1 | 3/2008 | Knight et al. | |
| 2010/0314093 A1 | 12/2010 | Refai-Ahmed et al. | |

OTHER PUBLICATIONS

David et al., "Hydrodynamic and Thermal Performance of a Vapor-Venting Microchannel Copper Heat Exchanger", Proceedings of the 6th Int'l. ASME Conference on Nanochannels, Microchannels and Minichannels, ICNMM2008-62269 (Jun. 2008).

David et al., "Temperature-Dependent Permeability of Microporous Membranes for Vapor Venting Heat Exchangers", Proceedings of IMECE 2008, IMECE2008-67934 (Nov. 2008).

David et al., "Visualization and Analysis of Venting from a Single Microchannel Two-Phase Copper Heat Exchanger", Proceedings of the ASME 2009 InterPACK Conference, InterPACK2009-89192 (Jul. 2009).

Sung et al., "Single-Phase and Two-Phase Hybrid Cooling Schemes for High-Heat Flux Thermal Management of Defense Electronics", Journal of Electronic Packaging, vol. 131 (Jun. 2009).

* cited by examiner

FLOW BOILING HEAT SINK STRUCTURE WITH VAPOR VENTING AND CONDENSING

BACKGROUND

The power dissipation of integrated circuit chips, and the modules containing the chips, continues to increase in order to achieve increases in processor performance. This trend poses a cooling challenge at both the module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable node configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single node by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the ability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or other liquid coolant.

BRIEF SUMMARY

In one aspect, provided herein is a heat sink comprising a thermally conductive structure, with at least one coolant-carrying channel and at least one vapor-condensing channel, and a membrane disposed between the at least one coolant-carrying channel and the at least one vapor-condensing channel. The membrane includes at least one vapor-permeable region. At least a portion of the at least one vapor-permeable region overlies a portion of the at least one coolant-carrying channel and facilitates removal of vapor from the at least one coolant-carrying channel to the at least one vapor-condensing channel. The heat sink further includes at least one coolant inlet coupled to provide a first coolant flow to the at least one coolant-carrying channel and a second coolant flow to condense vapor within the at least one vapor-condensing channel.

In another aspect, a cooled electronic apparatus is provided which comprises an electronics rack and a cooling apparatus. The electronics rack includes at least one heat-generating electronic component, and the cooling apparatus facilitates cooling of the at least one heat-generating electronic component. The cooling apparatus includes at least one heat sink. The at least one heat sink is coupled to the at least one heat-generating electronic component, and includes a thermally conductive structure, with at least one coolant-carrying channel and at least one vapor-condensing channel, and a membrane disposed between the at least one coolant-carrying channel and the at least one vapor-condensing channel. The membrane includes at least one vapor-permeable region. At least a portion of the at least one vapor-permeable region overlies a portion of the at least one coolant-carrying channel and facilitates removal of vapor from the at least one coolant-carrying channel to the at least one vapor-condensing channel. The at least one heat sink further includes at least one coolant inlet coupled to provide a first coolant flow to the at least one coolant-carrying channel, and a second coolant flow to condense vapor within the at least one vapor-condensing channel.

In a further aspect, a method of facilitating extraction of heat from a heat-generating electronic component is provided. The method includes: providing a heat sink comprising: a thermally conductive structure comprising at least one coolant-carrying channel and at least one vapor-condensing channel; a membrane disposed between the at least one coolant-carrying channel and the at least one vapor-condensing channel, the membrane comprising at least one vapor-permeable region, at least a portion of the at least one vapor-permeable region overlying a portion of the at least one coolant-carrying channel and facilitating removal of vapor from the at least one coolant-carrying channel to the at least one vapor-condensing channel; at least one coolant inlet coupled to provide a first coolant flow to the at least one coolant-carrying channel, and a second coolant flow to condense vapor within the at least one vapor-condensing channel; and coupling the heat sink to the at least one heat-generating electronic component so that heat generated by the at least one heat-generating electronic component is dissipated to coolant within the at least one coolant-carrying channel of the heat sink, wherein vapor generated within the at least one coolant-carrying channel can exhaust from the at least one coolant-carrying channel across the at least one vapor-permeable region of the membrane, and be condensed within the at least one vapor-condensing channel by the second coolant flow.

Additional features and advantages are realized through the techniques of the present invention. Other embodiments and aspects of the invention are described in detail herein and are considered part of a the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
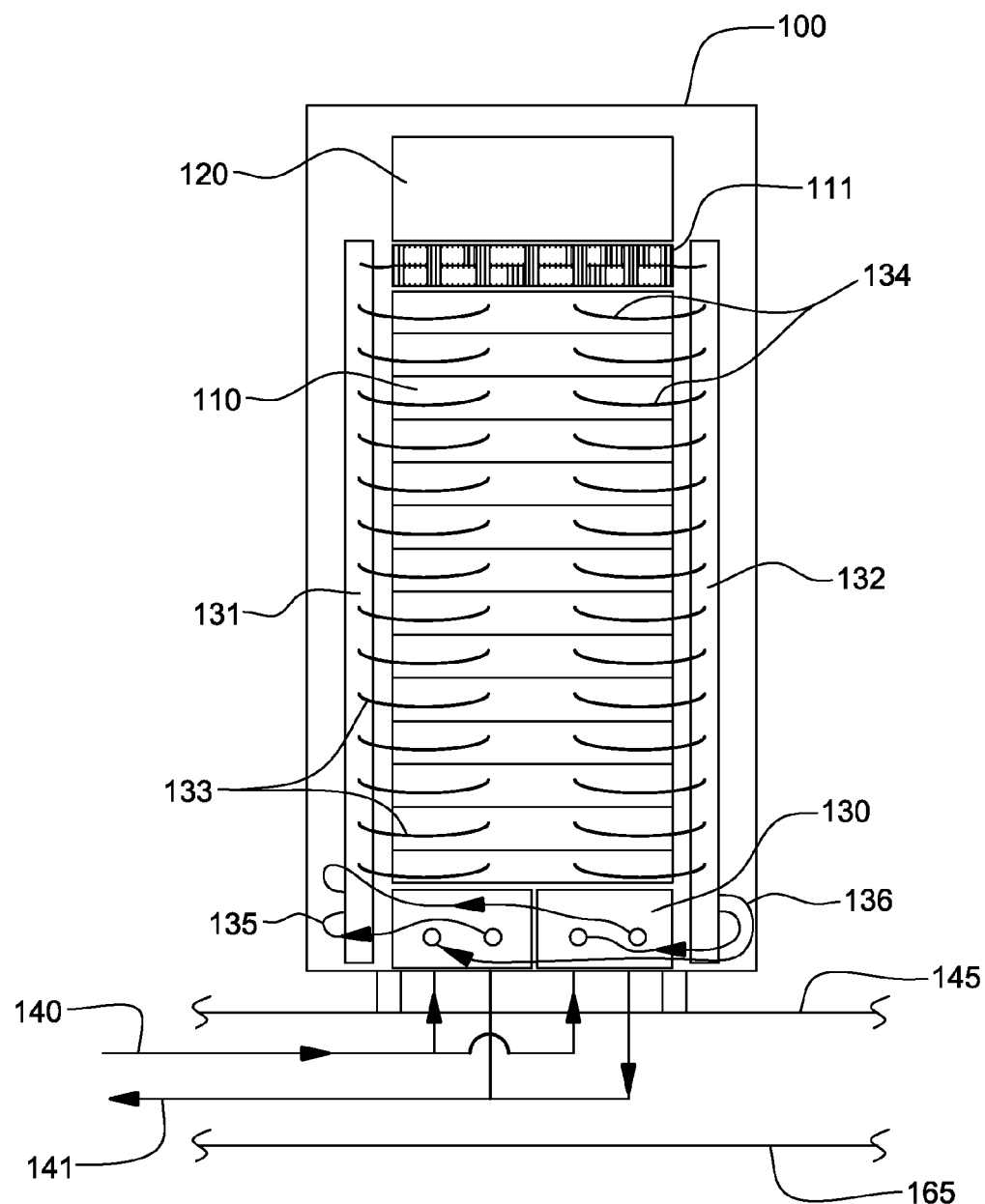
FIG. 1 is an elevational view of one embodiment of a cooled electronics rack comprising one or more heat-generating electronic components, and employing one or more heat sinks, in accordance with one or more aspects of the present invention.

As used herein, the terms "electronics rack" and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronic system requiring cooling. By way of example, an electronic component may comprise one or more integrated circuit dies, chips, modules and/or other heat-generating electronic devices to be cooled, such as one or more processors, memory modules and/or memory support structures. Further, as used herein, the terms "heat sink" and "coolant cooled heat sink" refer to thermally conductive structures having one or more channels (or passageways) form therein or passing therethrough, which facilitate the flow of coolant through the structure. One example, the coolant carrying channels comprise microchannels having a hydraulic diameter of 1.0 mm or less, for example, in the range of approximately 0.1 mm to 0.5 mm.

As used herein, "liquid-to-liquid heat exchanger" may comprise, for example, two or more coolant flow paths, formed of thermally conductive tubings (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

FIG. 1 depicts one embodiment of a liquid-cooled electronics rack 100 which employs a liquid-based cooling system. In one embodiment, liquid-cooled electronics rack 100 comprises a plurality of electronic subsystems or nodes 110, which may comprise processor or server nodes, as well as a disk enclosure structure 111. In this example, a bulk power assembly 120 is disposed at an upper portion of liquid-cooled electronics rack 100, and two modular cooling units (MCUs) 130 are disposed in a lower portion of the liquid-cooled electronics rack. In the embodiments described herein, the coolant is assumed to be water or an aqueous-based solution, again, by way of example only.

In addition to MCUs 130, the cooling system includes a system water supply manifold 131, a system water return manifold 132, and manifold-to-node fluid connect hoses 133 coupling system water supply manifold 131 to electronics structures 110, 111 and node-to-manifold fluid connect hoses 134 coupling the individual electronics subsystems 110, 111 to system water return manifold 132. Each MCU 130 is in fluid communication with system water supply manifold 131 via a respective system water supply hose 135, and each MCU 130 is in fluid communication with system water return manifold 132 via a respective system water return hose 136.

As illustrated, heat load of the electronic structures is transferred from the system water to cooler facility water supplied by facility water supply line 140 and facility water return line 141 disposed, in the illustrated embodiment, in the space between a raised floor 145 and a base floor 165.

Figure 2:
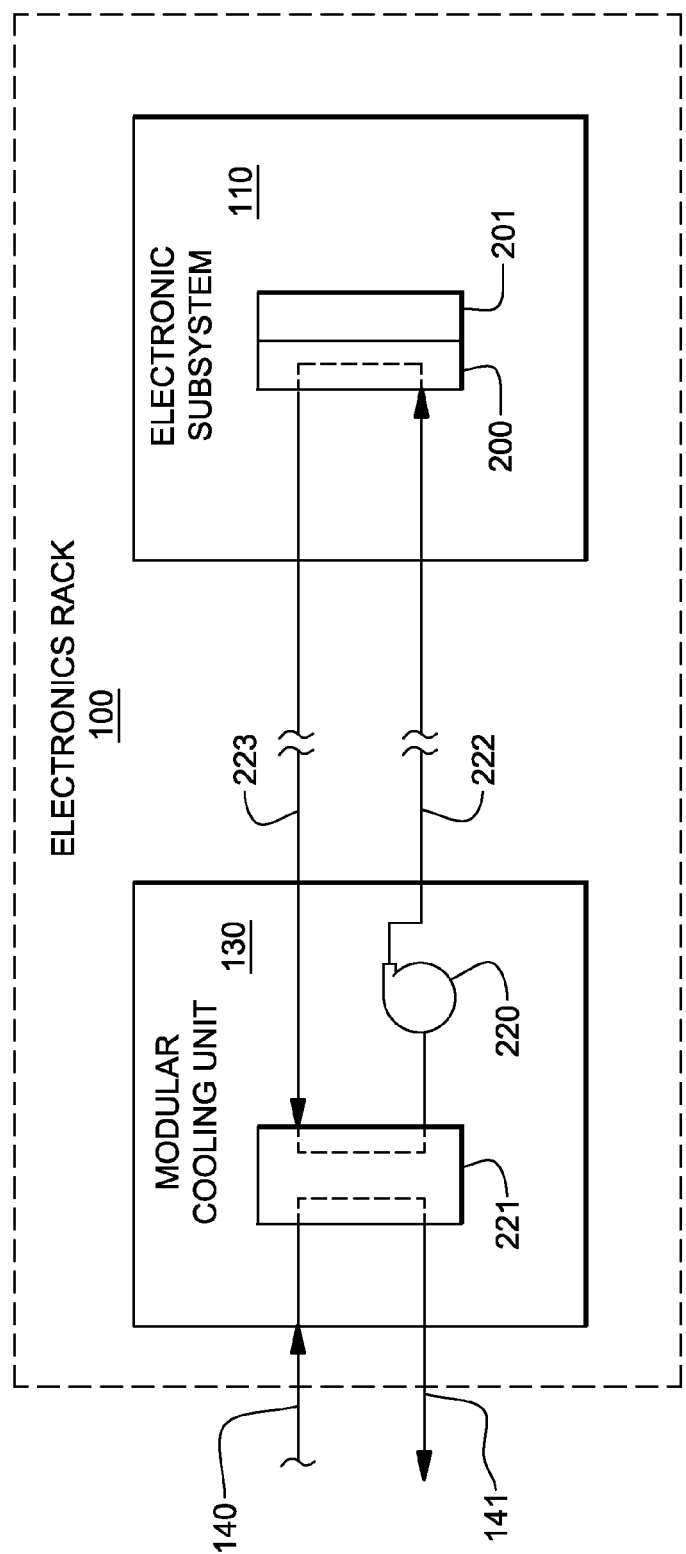
FIG. 2 is a schematic of one embodiment of an electronic subsystem or node of an electronics rack, wherein an electronic component and associated heat sink are cooled by system coolant provided by one or more modular cooling units disposed within the electronics rack, in accordance with one or more aspects of the present invention.

FIG. 2 schematically illustrates operation of the cooling system of FIG. 1, wherein a liquid-cooled heat sink 200 is shown coupled to an electronic component 201 of an electronic subsystem 110 within the electronics rack 100. Heat is removed from electronic component 201 via the system coolant circulated via pump 220 through heat sink 200 within the system coolant loop defined by liquid-to-liquid heat exchanger 221 of modular cooling unit 130, lines 222, 223 and heat sink 200. The system coolant loop and modular cooling unit are designed to provide coolant of a controlled temperature and pressure, as well as controlled chemistry and cleanliness to the electronic component(s). Furthermore, the system coolant is physically separate from the less controlled facility coolant in lines 140, 141, to which heat is ultimately transferred.

Figure 3:
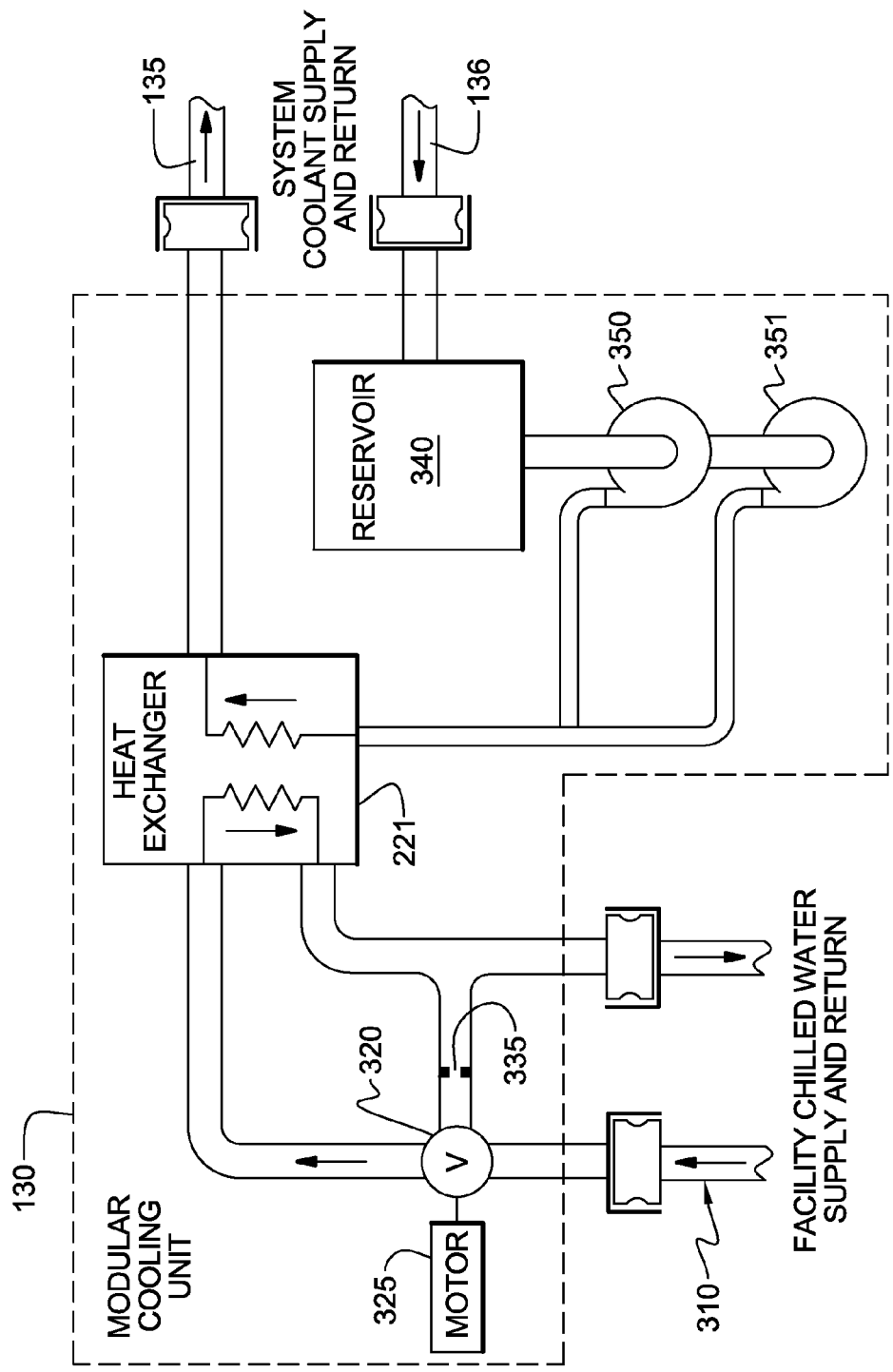
FIG. 3 is a schematic of one embodiment of a modular cooling unit for a cooled electronics rack such as depicted in FIGS. 1 & 2, in accordance with one or more aspects of the present invention.

FIG. 3 depicts a more detailed embodiment of a modular cooling unit 130, in accordance with an aspect of the present invention. As shown in FIG. 3, modular cooling unit 130 includes a facility coolant loop wherein building chilled, facility coolant is supplied 310 and passes through a control valve 320 driven by a motor 325. Valve 320 determines an amount of facility coolant to be passed through liquid-to-liquid heat exchanger 221, with a portion of the facility coolant possibly being returned directly via a bypass orifice 335. The modular cooling unit further includes a system coolant loop with a reservoir tank 340 from which system coolant is pumped, either by pump 350 or pump 351, into the heat exchanger 221 for conditioning and output thereof, as cooled system coolant to the associated rack unit to be cooled. The cooled system coolant is supplied to the system supply manifold and system return manifold of the liquid-cooled electronics rack via the system water supply hose 135 and system water return hose 136.

Figure 4:
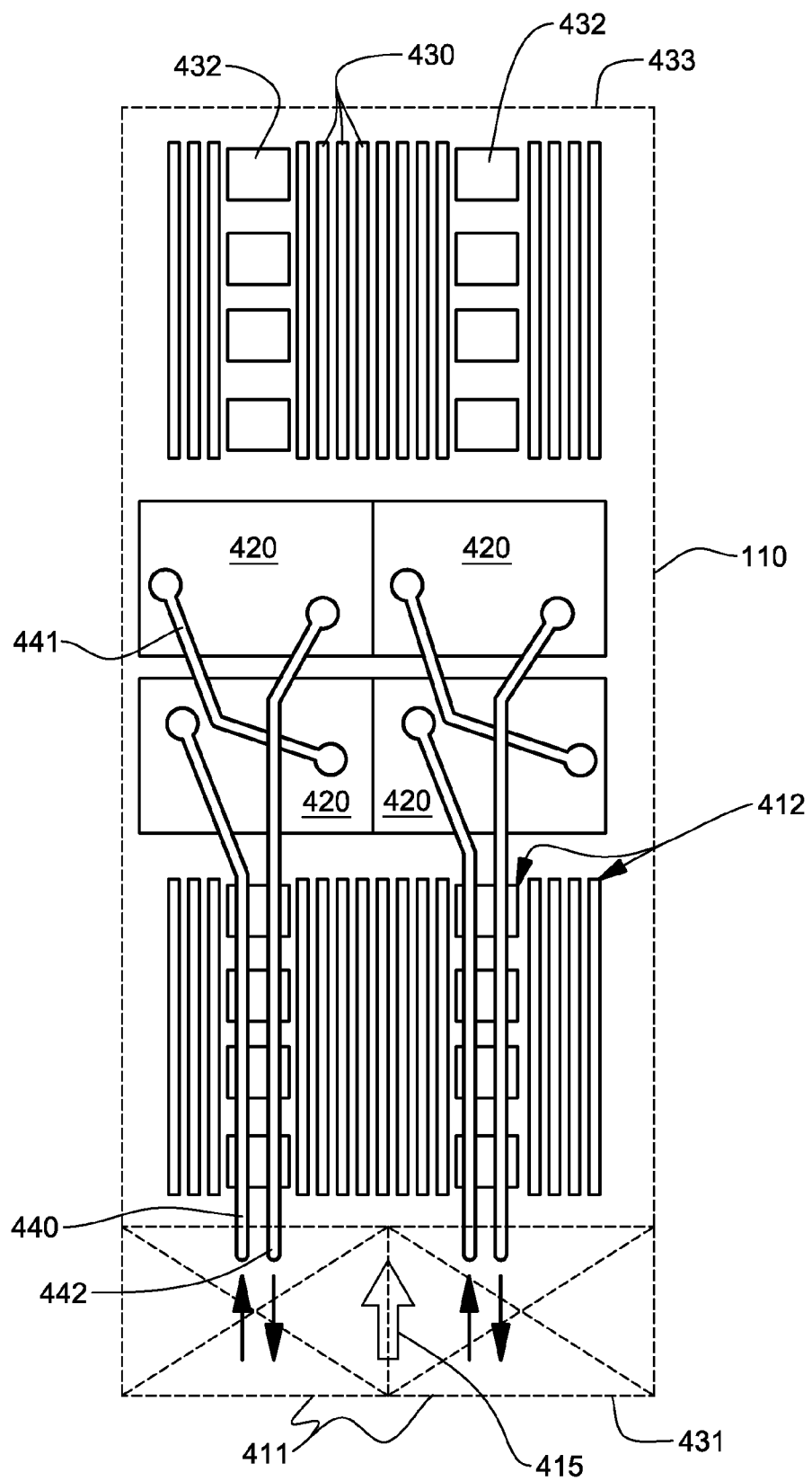
FIG. 4 is a plan view of one embodiment of an electronic subsystem layout illustrating multiple heat sinks cooling multiple electronic components of the electronic subsystem, in accordance with one or more aspects of the present invention.

FIG. 4 depicts one embodiment of an electronic subsystem 110 layout wherein one or more air moving devices 411 provide forced air flow 415 to cool multiple devices 412 within electronic subsystem 110. Cool air is taken in through a front 431 and exhausted out a back 433 of the drawer. The multiple devices to be cooled include multiple processor modules to which coolant-cooled heat sinks 420 (of a cooling system) are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronic subsystem 110, and partially arrayed near back 433 of electronic subsystem 110. Also, in the embodiment of FIG. 4, memory modules 430 and memory support modules 432 are cooled by air flow 415 across the electronic subsystem.

The illustrated liquid-based cooling system further includes multiple coolant-carrying tubes connected to and in fluid communication with coolant-cooled heat sinks 420. The coolant-carrying tubes comprise sets of coolant-carrying tubes, with each set including (for example) a coolant supply tube 440, a bridge tube 441 and a coolant return tube 442. In this example, each set of tubes provides liquid coolant to a series-connected pair of heat sinks 420 (coupled to a pair of processor modules). Coolant flows into a first heat sink of each pair via the coolant supply tube 440 and from the first heat sink to a second heat sink of the pair via bridge tube or line 441, which may or may not be thermally conductive. From the second heat sink of the pair, coolant is returned through the respective coolant return tube 442. In an alternate implementation, tubing is provided for separately passing coolant in parallel through the heat sinks of the electronic subsystem.

In one embodiment, the above-described cooling system can be employed with single-phase liquid-cooling. However, such a system requires a large liquid flow rate, and correspondingly large, high-power pumps, to avoid the liquid boiling and minimize sensible heating of the fluid as it absorbs the heat dissipated. The flow rate and pump power required may be reduced by an order of magnitude by leveraging the large, latent heat of vaporization, allowing the liquid to boil. Flow boiling enjoys high heat transfer coefficients, which can facilitate reducing the junction-to-ambient module thermal resistance, and can couple the module temperature to the boiling point of the coolant (or working fluid), resulting in better temperature uniformity.

However, flow boiling in the confined flow geometries of small heat sink channels, and small impingement jets in the heat sink, result in a detrimental rise in pressure due to bubble nucleation, bubble growth and advection of the vapor phase. The rise in pressure shifts saturation conditions, delaying the onset of boiling, and also results in the development of flow instabilities and flow maldistribution at the heat sink and node level, which can lead to premature liquid dryout. These issues have made flow boiling microstructures difficult to implement.

As used herein, a "microchannel", "micro-jet" or "microstructure" refers to a structure having a characteristic dimension less than 1.0 mm, for example, of approximately 0.5 mm or less. In one implementation, the microchannel has a hydraulic diameter of approximately 100 microns, and the jet channel (or jet orifice) has a diameter less than 100 microns. In the implementations described herein, the jet orifice diameter is assumed to be less than the microchannel width, since the jet orifice injects coolant into the microchannel(s) of the heat sink.

Disclosed hereinbelow are various heat sink structures which combine local jet impingement of coolant (through jet nozzles (or jet orifices)) with local vapor removal via a porous, vapor-permeable membrane, which minimizes the various challenges encountered during flow boiling in microstructures. The microchannels provide a larger heat transfer area and improved thermal performance as compared to larger, conventional channels, and by incorporating a vapor-permeable membrane within the heat sink structure, vapor generated within the microchannels can escape the confined microchannel geometry directly into a separate vapor transport channel/plenum. This local removal of vapor provides several advantages, including: a reduced two-phase flow pressure drop and a reduced required pumping power for circulating coolant through the heat sink structure(s); a lower and more uniform coolant saturation temperature within the heat sink structure; an improved heat transfer coefficient and reduced heat sink thermal resistance due to phase change; improved wetting and improved jet impingement; and a reduced possibility of flow instabilities which might lead to premature dryout within the heat sink.

The separated vapor can be reintroduced into the coolant exhaust from the cooling microchannels within the heat sink structure itself, or at a node level within an electronics rack comprising the heat sink structure. Alternatively, the vapor may be piped directly to a rack-level manifold, as explained further below. Secondary, buoyancy-driven vapor separation occurs in the rack manifold, with vapor rising to a condenser disposed in the upper portion of the rack unit. The vapor is then condensed back to liquid, which rejoins the liquid coolant returning to the modular cooling unit, where the liquid can be cooled and pumped back to the nodes of the electronics rack. In one embodiment, the coolant flowing through the heat sink structures comprises water, and the membrane is a porous, hydrophobic membrane. Further, in one embodiment, the membrane may be modified to have a spatially-varying porosity and stiffness, which allows for both the injection of fluid, through jet orifices provided in rigid portions of the membrane, and local removal of vapor generated within the microchannels. Alternatively, a plate mask could be associated with the vapor-permeable region of the membrane to define a multilayer structure, which comprises one or more coolant injection regions and one or more vapor removal regions from the microchannels. Note that in the embodiments described herein, the membrane, or the membrane and plate mask structure, overlie and form part of the coolant-carrying channels so as to be exposed to vapor within the coolant-carrying channels of the heat sink. For example, in one embodiment, the membrane forms a top portion of each of the coolant-carrying channels of the heat sink.

FIGS. 5A-5D depict one embodiment of a cooled electronic structure, generally denoted 500, in accordance with one or more aspects of the present invention. Cooled electronic structure 500 includes, in this embodiment, an electronic component 510, such as an electronic module, mounted to a printed circuit board 501 with an associated back plate 502 (for example, a metal back plate). A heat sink 520 is mechanically coupled via securing mechanisms 505 to back plate 502 of printed circuit board 501, which provide a compressive load forcing heat sink 520 in good thermal contact with electronic component 510. Electronic component 510 includes, in this embodiment, an integrated circuit chip 511 connected to a chip carrier or substrate 513 via, for example, a first plurality of solder ball connections 512. Similarly, substrate 513 is electrically connected to printed circuit board 501 via, for example, a second plurality of solder ball connections 514. A thermally conductive cap 516 is interfaced to integrated circuit chip 511 via a first thermal interface material 515, such as a silicone-based paste or grease, pad, epoxy or solder. A second thermal interface material 517 facilitates thermal interfacing of cap 516 to heat sink 520.

Figure 5A:
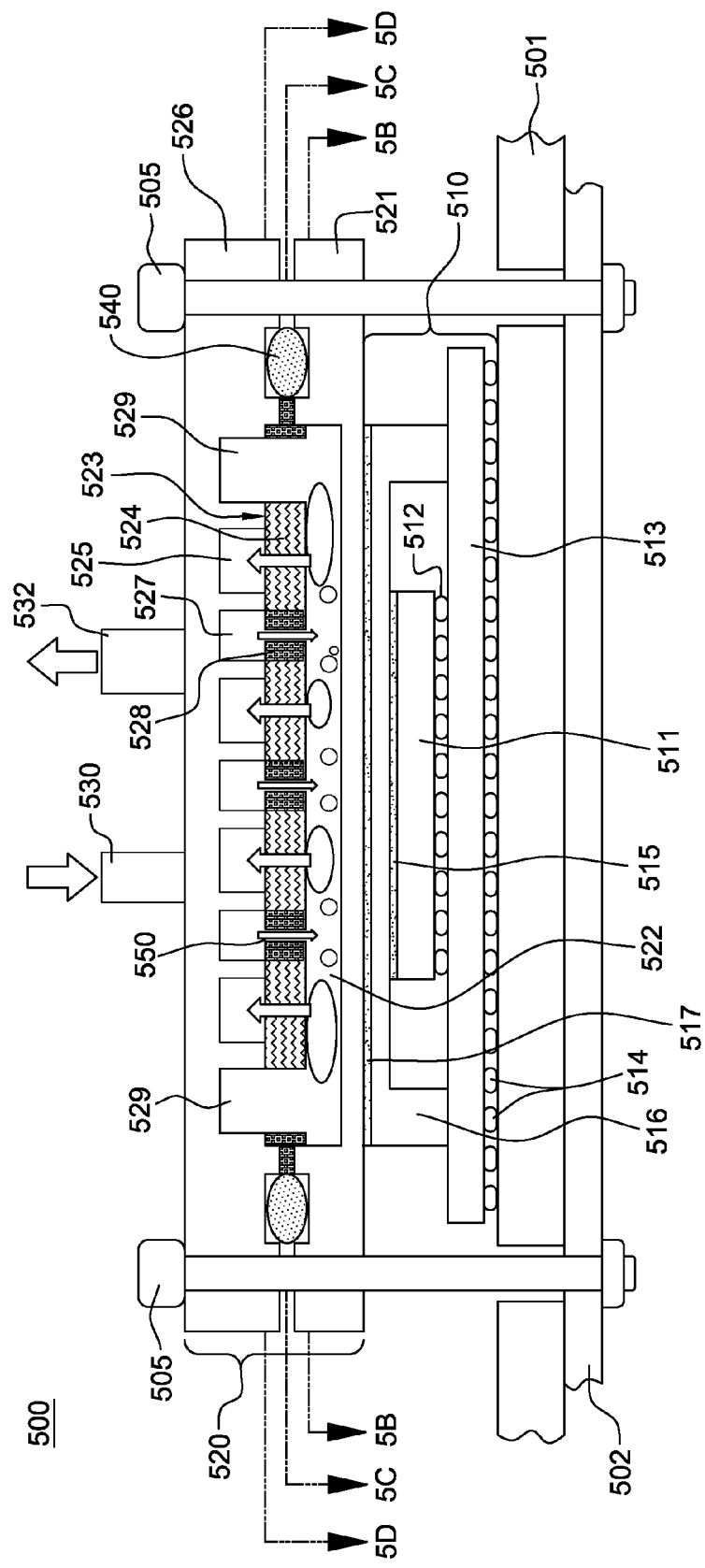
FIG. 5A is a cross-sectional elevational view of one embodiment of a cooled electronic structure comprising a heat-generating electronic component and a heat sink with a vapor-permeable membrane, and taken along lines 5A-5A in FIGS. 5B & 5D, in accordance with one or more aspects of the present invention.
Figure 5B:
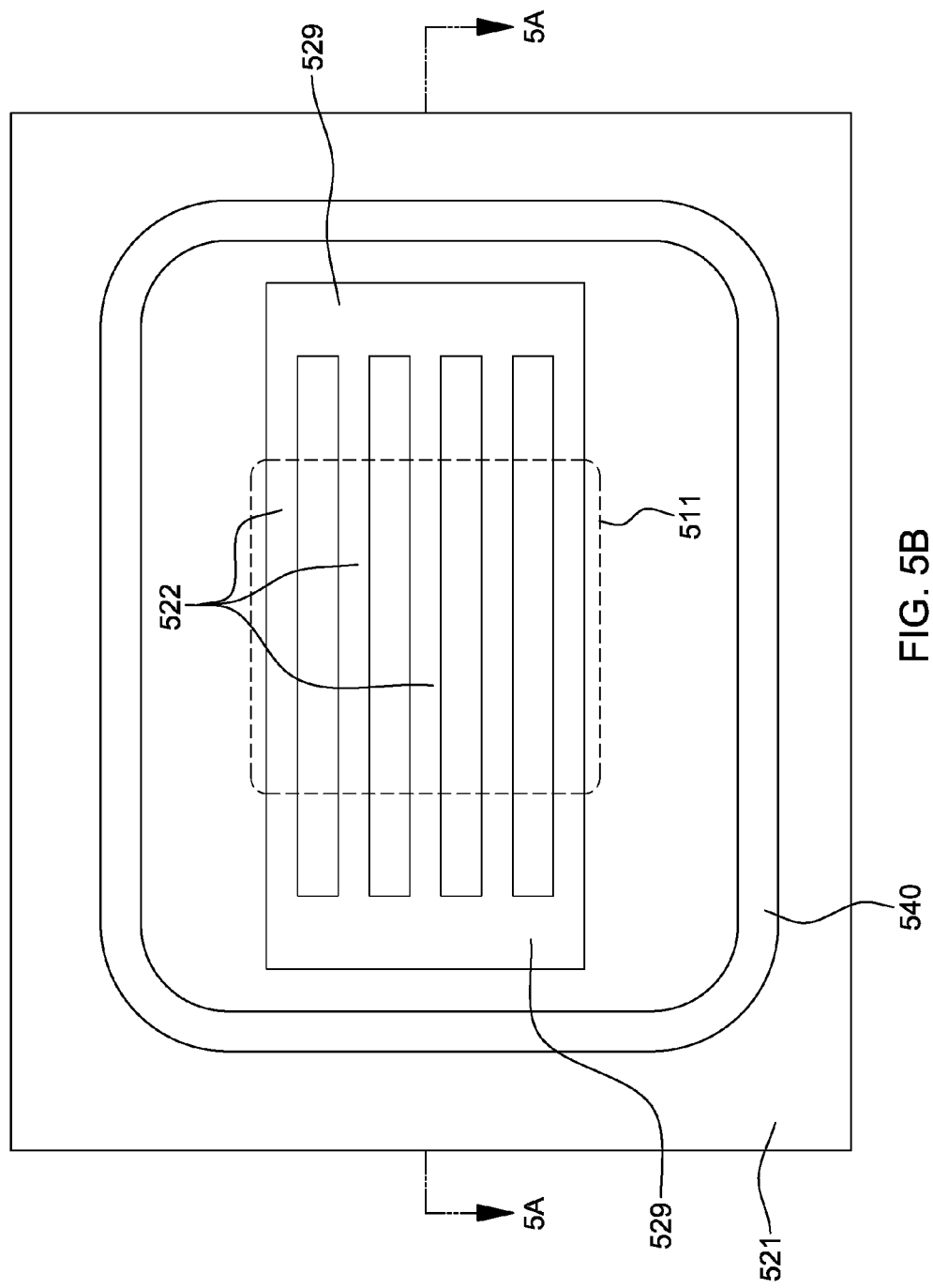
FIG. 5B is a cross-sectional plan view of the cooled electronic structure of FIG. 5A, taken along line 5B-5B thereof, in accordance with one or more aspects of the present invention.
Figure 5C:
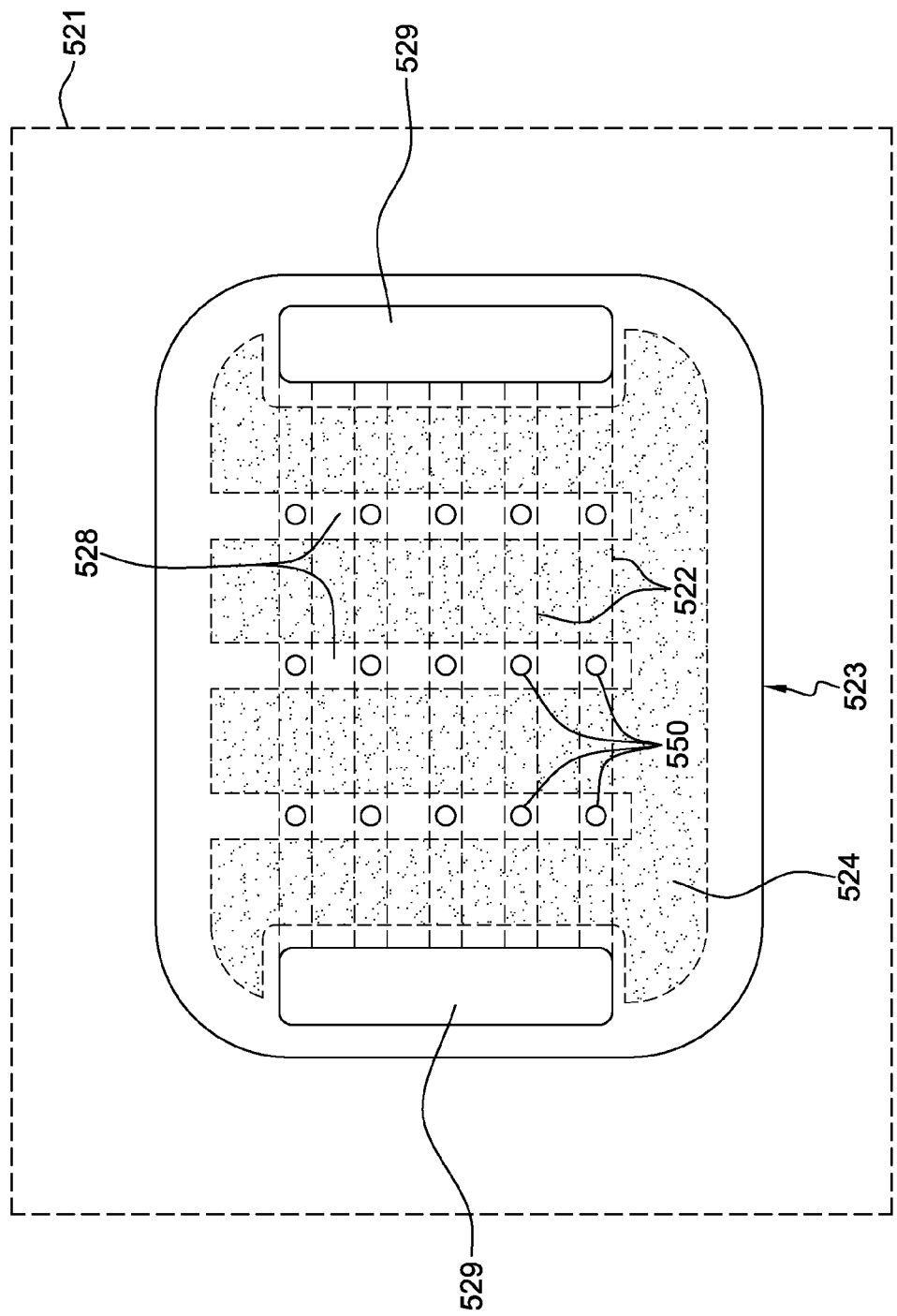
FIG. 5C is a cross-sectional plan view of the cooled electronic structure of FIG. 5A, taken along line 5C-5C thereof, in accordance with one or more aspects of the present invention.
Figure 5D:
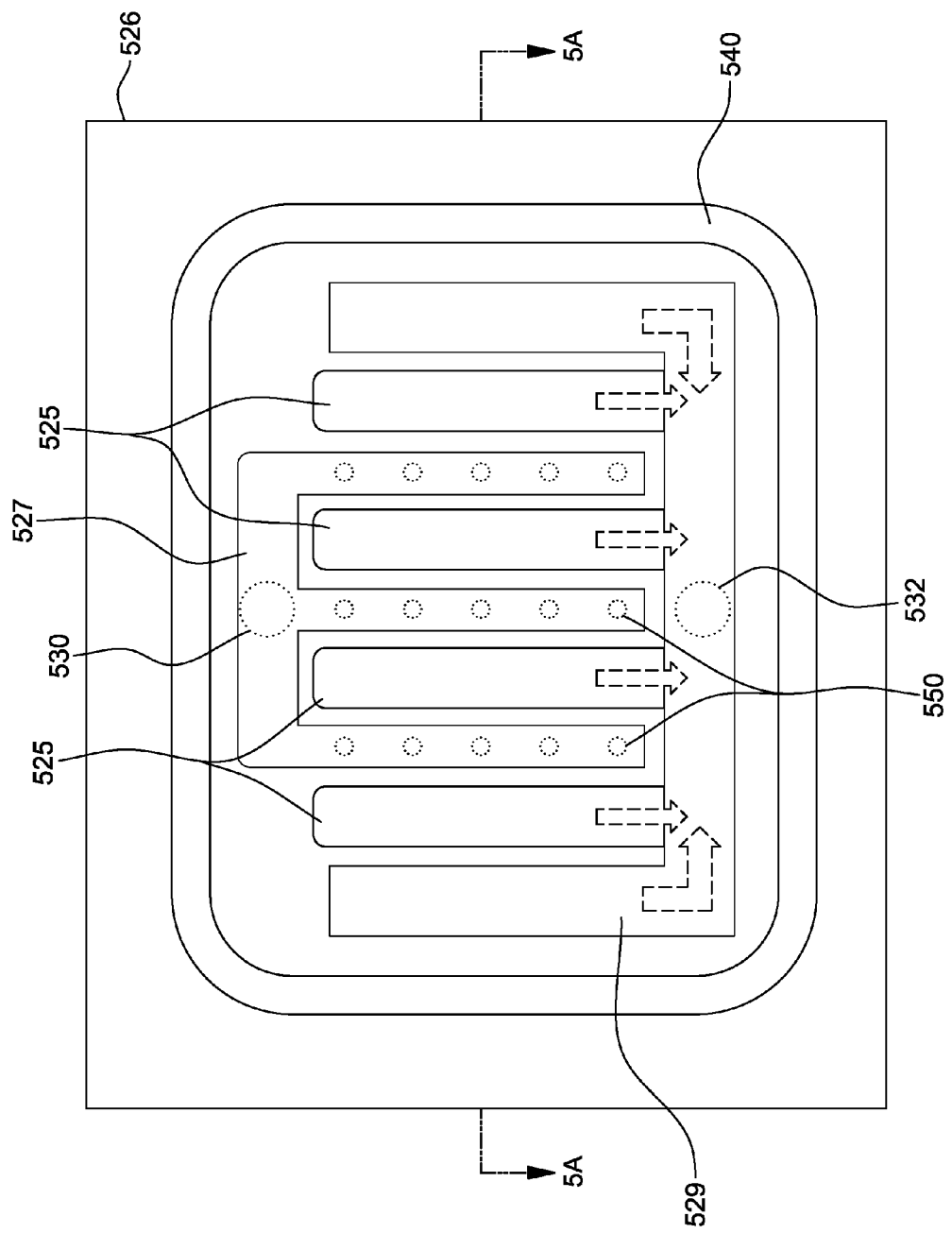
FIG. 5D is a cross-sectional plan view of the cooled electronic structure of FIG. 5A, taken along line 5D-5D thereof, in accordance with one or more aspects of the present invention.

In this embodiment, heat sink 520 comprises a multilayer heat sink with a heat sink base 521, a membrane structure 523 and a heat sink cap 526, which are respectively depicted in cross-sectional plan view in FIGS. 5B-5D. Unless otherwise indicated, referring collectively to FIGS. 5A-5D, heat sink base 521 comprises one or more coolant-carrying channels 522, each of which may comprise a microchannel structure, such as described above. Note that five coolant-carrying microchannels are depicted in FIG. 5B, by way of example only. More or less coolant-carrying channels may be defined within the heat sink base, as desired. Heat from the electronic component is rejected to coolant within the coolant-carrying channels in the heat sink base. Two-phase cooling of the heat-generating electronic component is achieved by at least partial vaporization of the coolant (i.e., working fluid) within the one or more coolant-carrying channels of the heat sink.

As illustrated in FIGS. 5A & 5C, various regions of the coolant-carrying channels are capped by at least one vapor-permeable region 524 of membrane structure 523. As illustrated in FIGS. 5A & 5D, disposed over these regions are vapor transport channels 525 formed in heat sink cap 526. Thus, localized venting of vapor directly from the coolant-carrying channels, across the vapor-permeable membrane into the vapor transport channels is provided within the heat sink. In one embodiment, membrane 523 is modified to include, in addition to at least one vapor-permeable region 524, at least one vapor-impermeable region 528. In one embodiment, the at least one vapor-impermeable region 528 comprises a plurality of parallel-extending digits that are interdigitated with a plurality of vapor-permeable areas of the at least one vapor-permeable region 524, as illustrated in FIG. 5C. The vapor-impermeable digits extend substantially transverse to the coolant-carrying channels 522.

In the embodiment depicted, at least one orifice 550 is provided in each of the vapor-impermeable digits where extending over a respective coolant-carrying channel. Coolant is introduced into the coolant-carrying channels through orifices 550 via liquid coolant delivery channels 527 in fluid communication with a liquid coolant inlet 530 of heat sink 520. Coolant exhaust is discharged via coolant exhaust channels 529 extending through an opening in the membrane 523 into heat sink cap 526. Coolant exhaust channels 529 are in fluid communication with a coolant exhaust outlet port 532 of heat sink 520. In this embodiment, the vapor transfer channel 525 vent within the heat sink into coolant exhaust channel 529, as illustrated in the plan view of FIG. 5D. Note that in this embodiment, the orifices 550 in the vapor-impermeable digits of the membrane are jet orifices, which provide jet impingement of coolant into the respective coolant-carrying channels of the heat sink. Note also that, in this embodiment, a single liquid coolant inlet port and a single coolant exhaust outlet port are provided in the heat sink.

As illustrated in FIGS. 5B & 5D, heat sink base 521 and heat sink cap 526 are configured to accommodate an O-ring 540 to seal coolant within the heat sink. Coolant and vapor are additionally sealed within the heat sink by vapor-impermeable region 528, which is provided to extend around the perimeter of the membrane, that is, where held by the heat sink base and heat sink cap as illustrated in FIG. 5A.

In one embodiment, the heat sink base and heat sink cap are fabricated of a metal material, such as copper, the coolant comprises water, and the membrane is a porous hydrophobic membrane, such as a vapor-permeable PTFE or polypropylene material, such as the membranes available, for example, from Sterlitech Corp., of Kent, Wash., USA, or Sumitomo Electric Interconnect Products, Inc., of San Marcos, Calif., USA.

Figure 6:
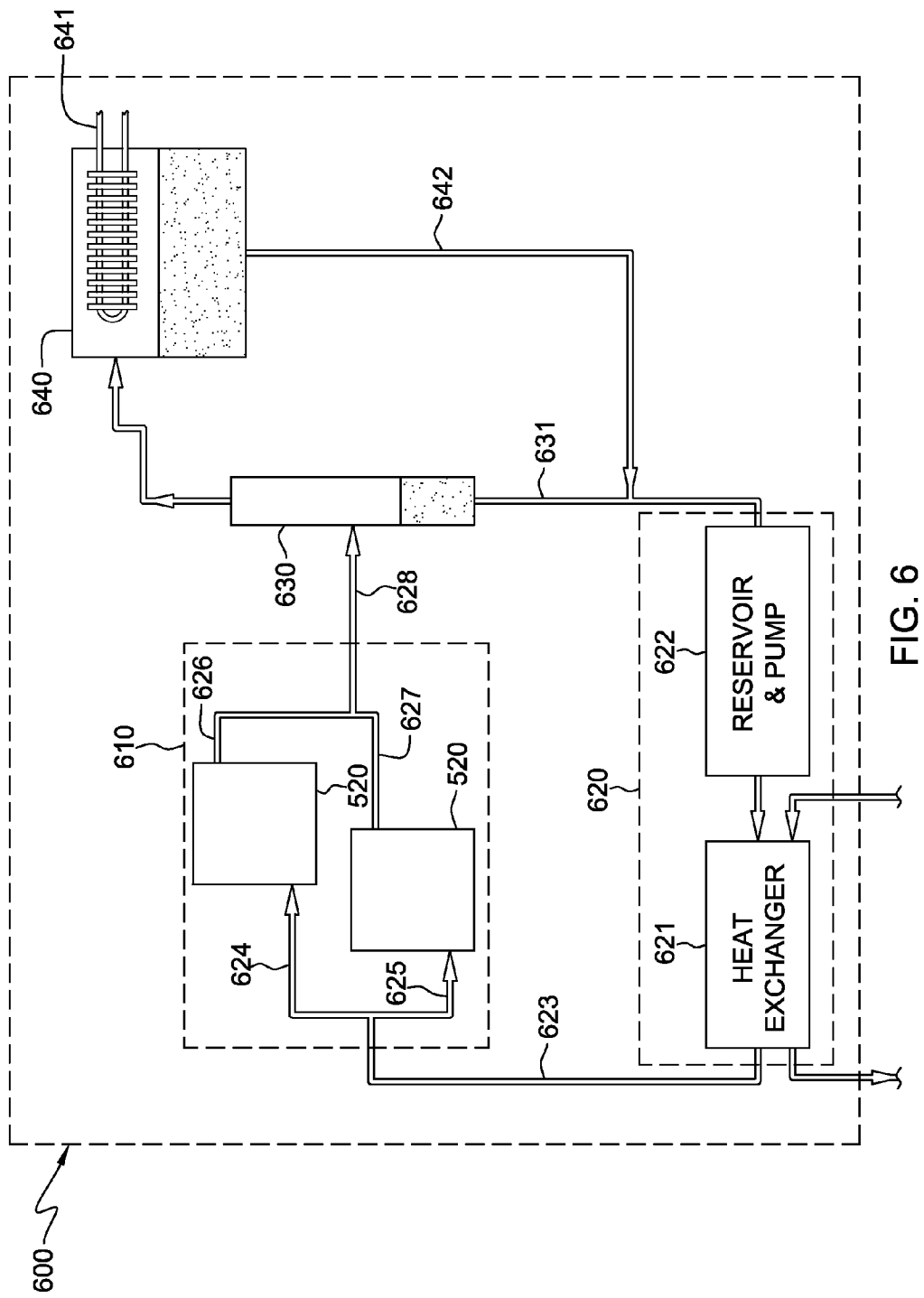
FIG. 6 is a schematic one embodiment of a cooled electronics apparatus comprising an electronic subsystem or node with multiple heat sinks and illustrating rack-level vapor separation and condensing, in accordance with one or more aspects of the present invention.

FIG. 6 depicts one embodiment of a rack-level cooling apparatus comprising multiple heat sink structures, such as depicted in FIGS. 5A-5D. In this embodiment, two heat sink structures 520 are illustrated within an electronic subsystem 610, such as a node of an electronics rack 600. The cooling apparatus includes a modular cooling unit 620, such as described above. Modular cooling unit 620 includes a liquid-to-liquid heat exchanger 621 and a reservoir with an associated pump 622 for providing cooled liquid coolant via a coolant supply manifold 623 and node-level supply lines 624, 625 to the coolant inlet ports of the respective heat sinks 520. In the embodiment of FIGS. 5A-5D, the vented vapor is combined within the heat sink with the coolant exhaust so that a single coolant exhaust line 626, 627 extends from each heat sink 520. These coolant exhaust lines 626, 627 are coupled in fluid communication (in this embodiment) at the node level into a single node-level coolant exhaust line 628, which is coupled in fluid communication with a phase separation manifold 630 of the rack unit. Phase separation manifold 630 comprises a buoyancy-driven phase separator, with the coolant exhaust comprising (in one mode of operation) both vapor and liquid. Vapor within the manifold rises to a vapor condenser 640 disposed in an upper region of the electronics rack 600. In one embodiment, the condenser is liquid-cooled 641, for example, via a facility coolant. The resultant condensate is returned via a condensate return line 642 to the liquid coolant return line 631 coupling the phase separation manifold 630 to the modular cooling unit 620, to repeat the process.

Figure 7:
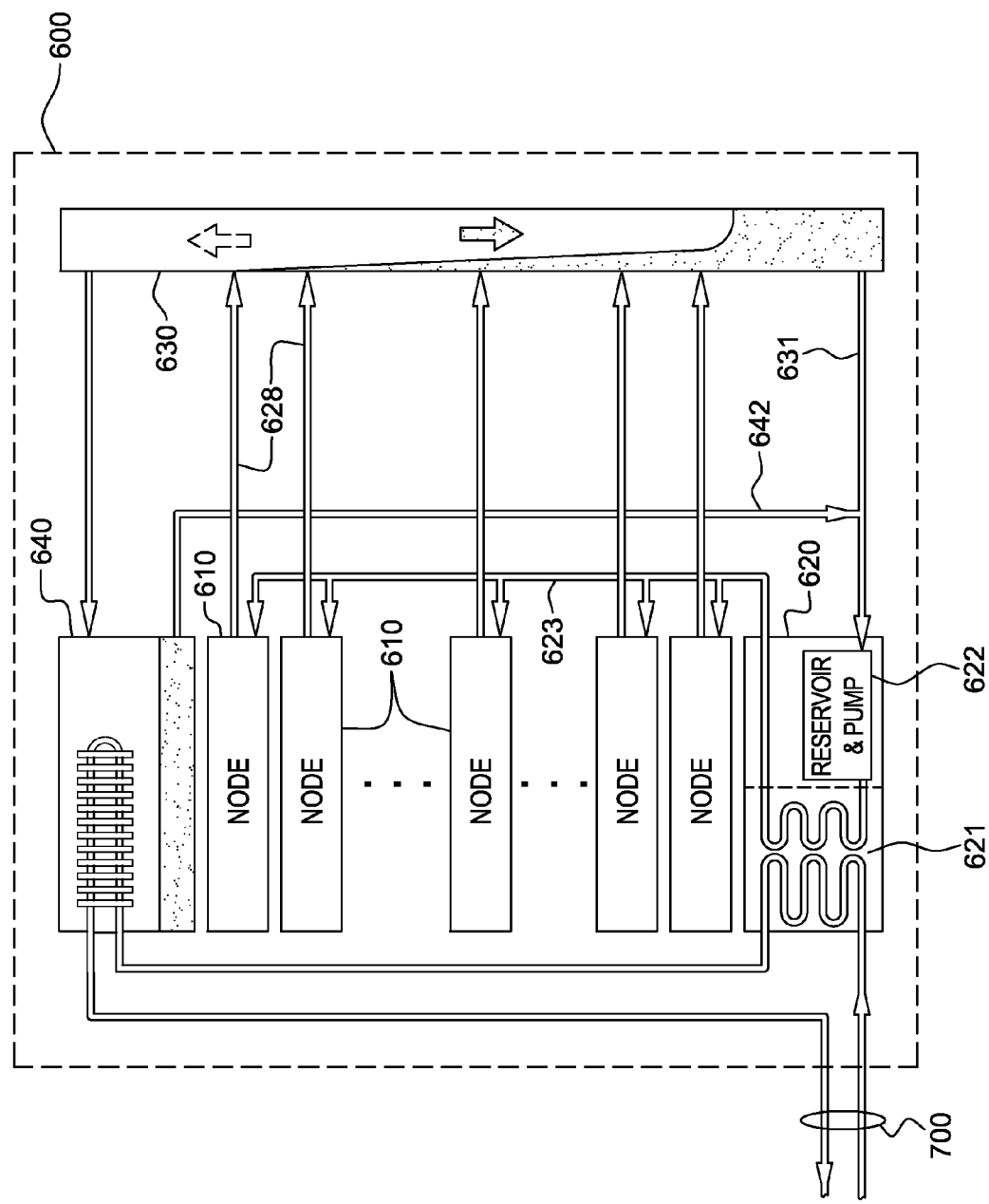
FIG. 7 depicts a more detailed embodiment of the cooled electronics apparatus of FIG. 6, illustrating rack-level vapor separation and condensing, in accordance with one or more aspects of the present invention.

FIG. 7 depicts a more detailed embodiment of the cooling apparatus and electronics rack of FIG. 6. In this embodiment, heat exchanger 621 of modular cooling unit 620 is shown to comprise a liquid-to-liquid heat exchanger, with a facility coolant loop 700 providing facility coolant to the liquid-to-liquid heat exchanger, as well as to vapor-condenser 640. In the embodiment of FIG. 7, the phase separation manifold 630 is shown to comprise an elongate, vertically-oriented structure, such as a long tube with a relatively large internal diameter. Multiple nodes 610 are also illustrated in FIG. 7, with each node receiving liquid coolant via coolant supply manifold 623, and rejecting (in one embodiment) two-phase coolant exhaust via node-level coolant exhaust line 628 to phase separation manifold 630.

Referring collectively to FIGS. 5A-7, operationally, at low heat fluxes, coolant impinges on the coolant-carrying channel surfaces of the heat sink base and flows down the coolant-carrying channels as a single-phase liquid to the coolant exhaust plenum at either end of the channels. The liquid-impermeable nature of the vapor-permeable membrane stops the liquid from leaking from the coolant-carrying channels through the pores of the membrane into the vapor transport channels in the heat sink cap. The liquid impingement has a higher heat transfer coefficient, and the relatively shorter flow lengths facilitate reducing flow pressure drop, and may maintain better temperature uniformity compared with coolant delivery parallel to the heated surface. The liquid flows to the external cooling apparatus (as shown in FIGS. 6 & 7), where it drops down the phase separation manifold to the modular cooling unit. Within the modular cooling unit, the heated coolant is cooled by the heat exchanger, with heat being rejected to the facility coolant passing through the heat exchanger. The cooled liquid coolant is then pumped back to the nodes of the electronics rack, and in particular, to flow through the heat sinks, in a manner such as described above.

At higher heat fluxes, a portion of the impinging coolant vaporizes within the coolant-carrying channels, with a liquid and vapor mixture flowing down the length of the channels. However, the vapor phase may also egress through the vapor-permeable region(s) of the membrane into the vapor transport channels of the heat sink cap, leaving a relatively liquid-rich coolant exhaust flowing in the coolant channels. This local removal of the vapor helps maintain a high heat transfer coefficient, reduces the pressure drop, and reduces dryout within the heat sink. The separated vapor can then be reintroduced into the coolant exhaust (e.g., a two-phase exhaust mixture) exiting from the edges of the heat sink base, through the large openings in the membrane, to the heat sink cap (see FIGS. 5A-5D). The reintroduction of the vapor in the heat sink cap does not significantly add to the pressure drop, due to the larger length scales of the channels in the heat sink cap. Doing so also simplifies plumbing external to the heat sink, as shown schematically in FIG. 6. The two-phase coolant effluent then flows to the separation manifold of the electronics rack, where the liquid drops down to the modular cooling unit, and the vapor rises to the vapor condenser disposed in the upper region of the electronics rack. Within the vapor condenser, the vapor is condensed, for example, with the assistance of facility chilled water passing through the vapor condenser. The condensed liquid then flows down the rack to be merged with the liquid drip from the phase separation manifold, and enters the modular cooling unit to be chilled and pumped back to the nodes to repeat the process.

FIGS. 8A-8D depict an alternate embodiment of a cooled electronics structure, generally denoted 800, in accordance with one or more aspects of the present invention. Cooled electronic structure 800 is similar to cooled electronic structure 500 of FIGS. 5A-5D, except the layers that make up heat sink 801 of FIGS. 8A-8D are modified from the layers that make up heat sink 520 (see FIG. 5A).

Figure 8A:
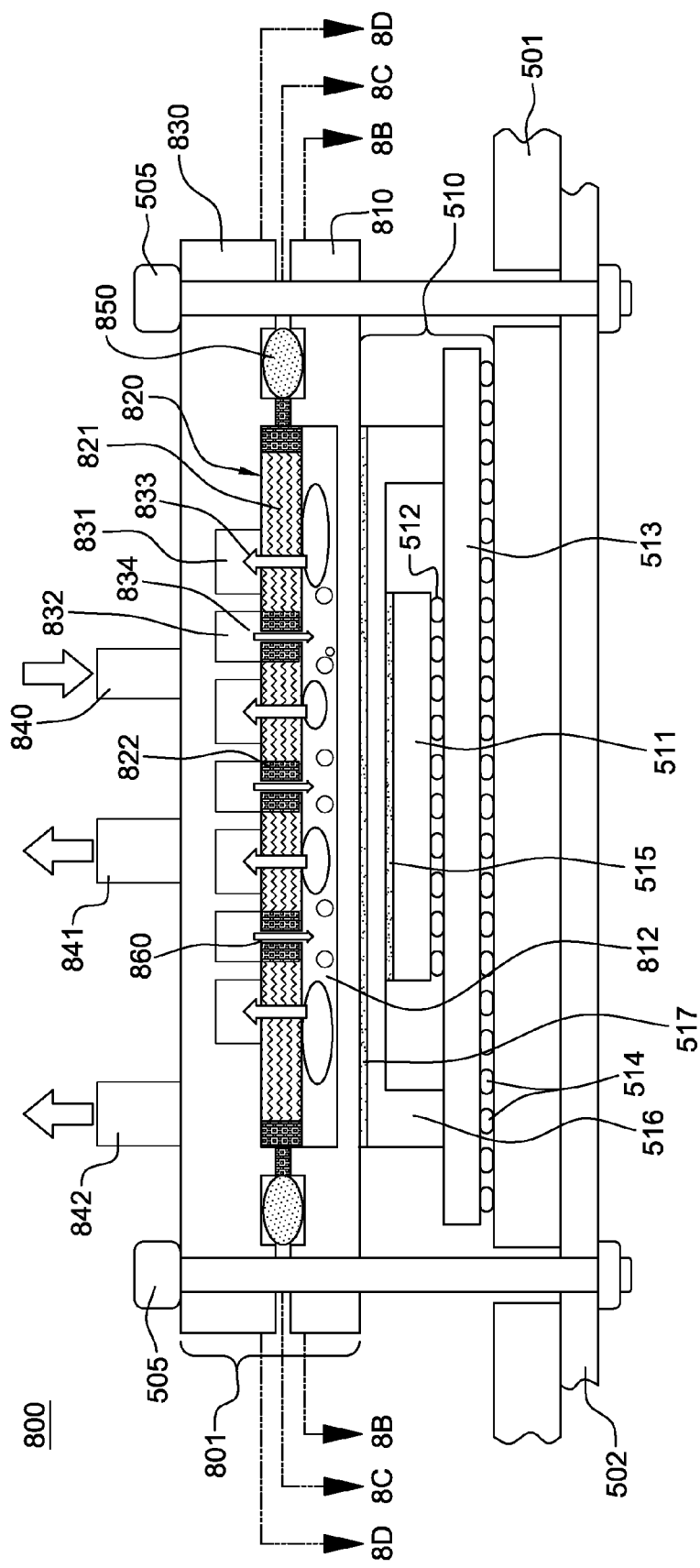
FIG. 8A is a cross-sectional elevational view of another embodiment of a cooled electronic structure, and taken along lines 8A-8A in FIGS. 8B & 8D, in accordance with one or more aspects of the present invention.

Specifically, as shown in FIG. 8A, cooled electronic structure 800 includes, in this embodiment, electronic component 510, such as an electronic module, mounted to printed circuit board 501, with an associated back plate 502. Heat sink 801 is mechanically coupled via securing mechanisms 505 to back plate 502 of printed circuit board 501, which provide compressive loading of heat sink 801 to electronic component 510. Electronic component 510 includes, in this embodiment, integrated circuit chip 511 connected to chip carrier or substrate 513 via a first plurality of solder ball connections 512. Substrate 513 is electrically connected to printed circuit board 501 via a second plurality of solder ball connections 514. A thermally conductive cap 516 is interfaced to integrated circuit chip 511 via first thermal interface material 515, and to heat sink 801 via second interface material 517, which may be the same or different interface materials.

Figure 8B:
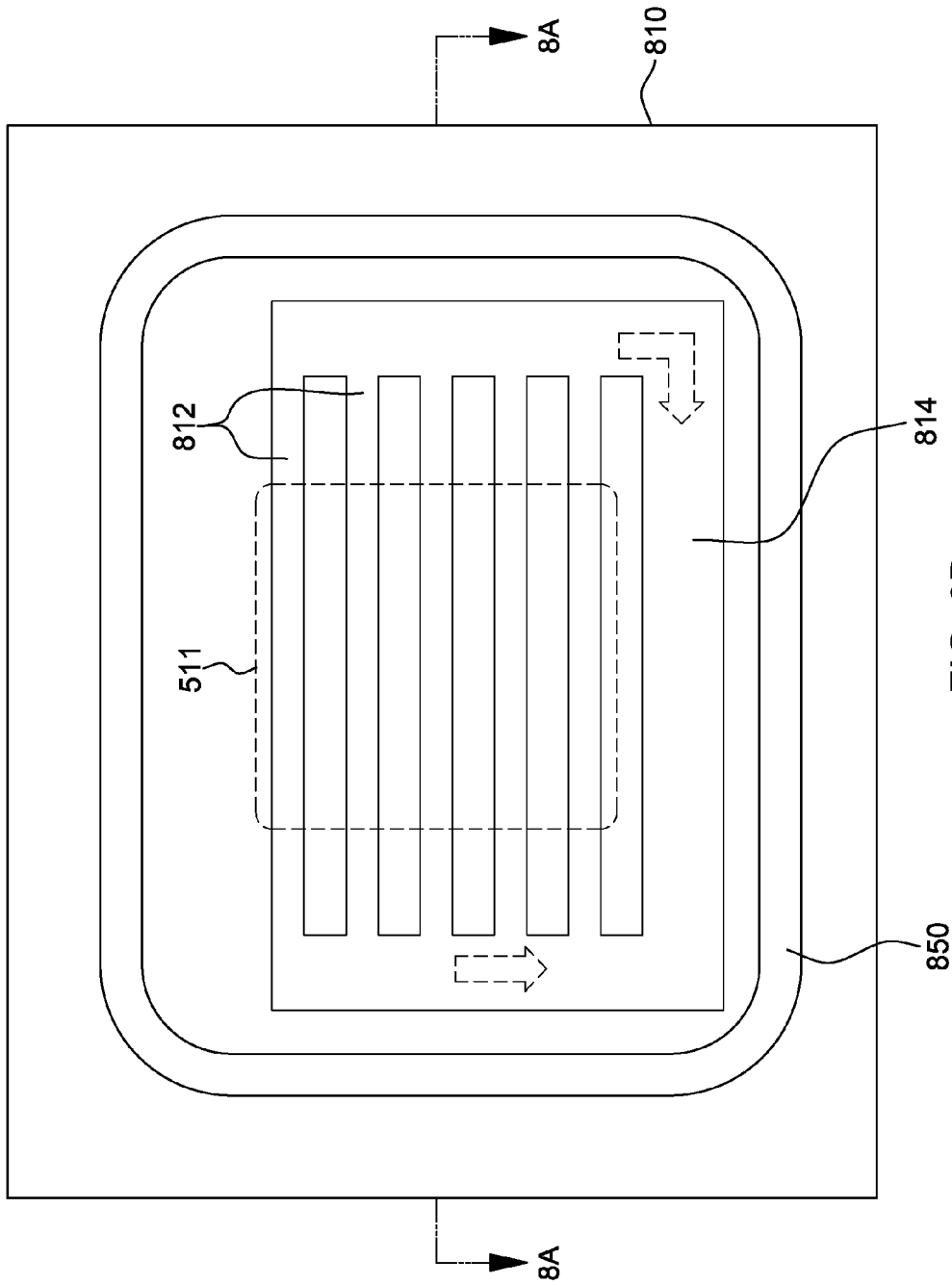
FIG. 8B is a cross-sectional plan view of the cooled electronic structure of FIG. 8A, taken along line 8B-8B thereof, in accordance with one or more aspects of the present invention.
Figure 8C:
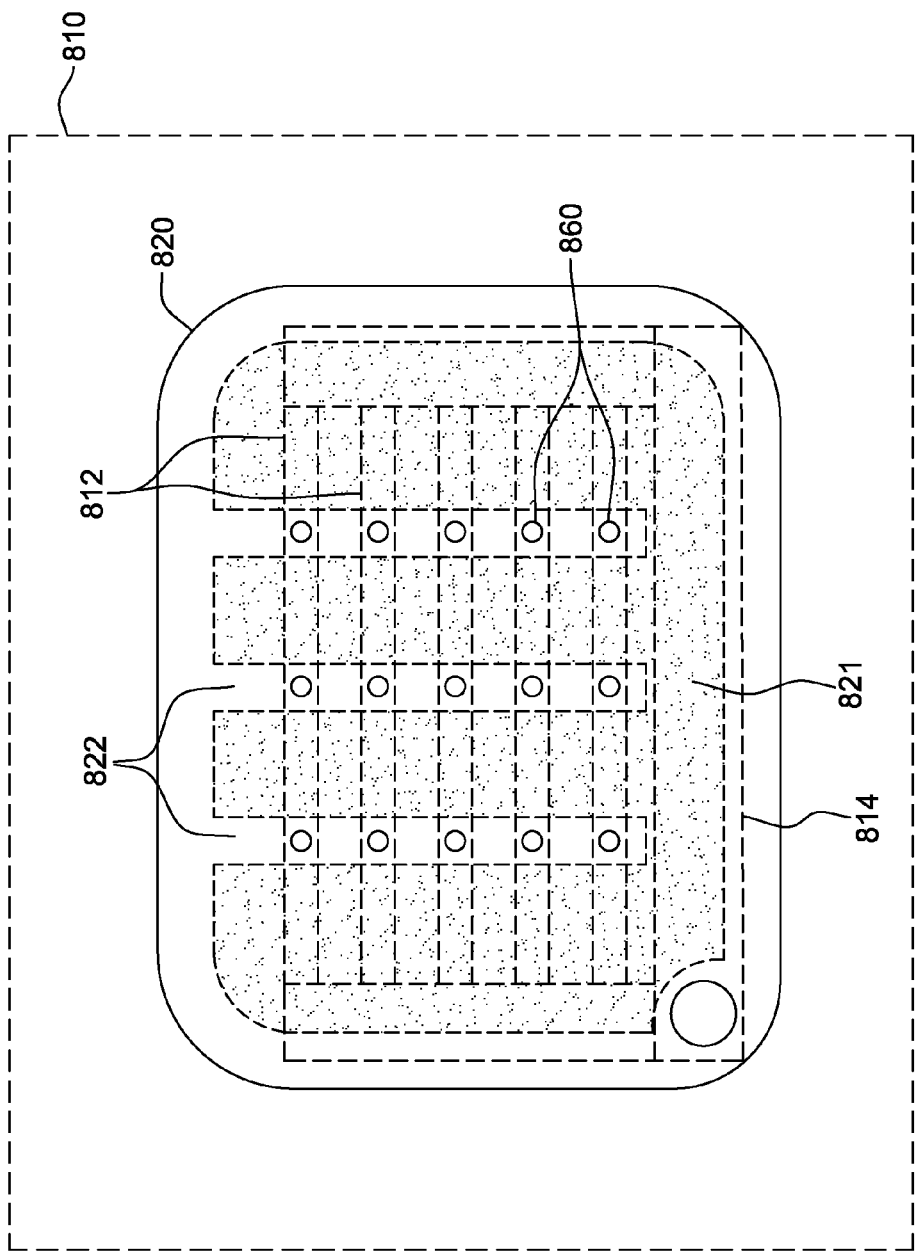
FIG. 8C is a cross-sectional plan view of the cooled electronic structure of FIG. 8A, taken along the line 8C-8C thereof, in accordance with one or more aspects of the present invention.
Figure 8D:
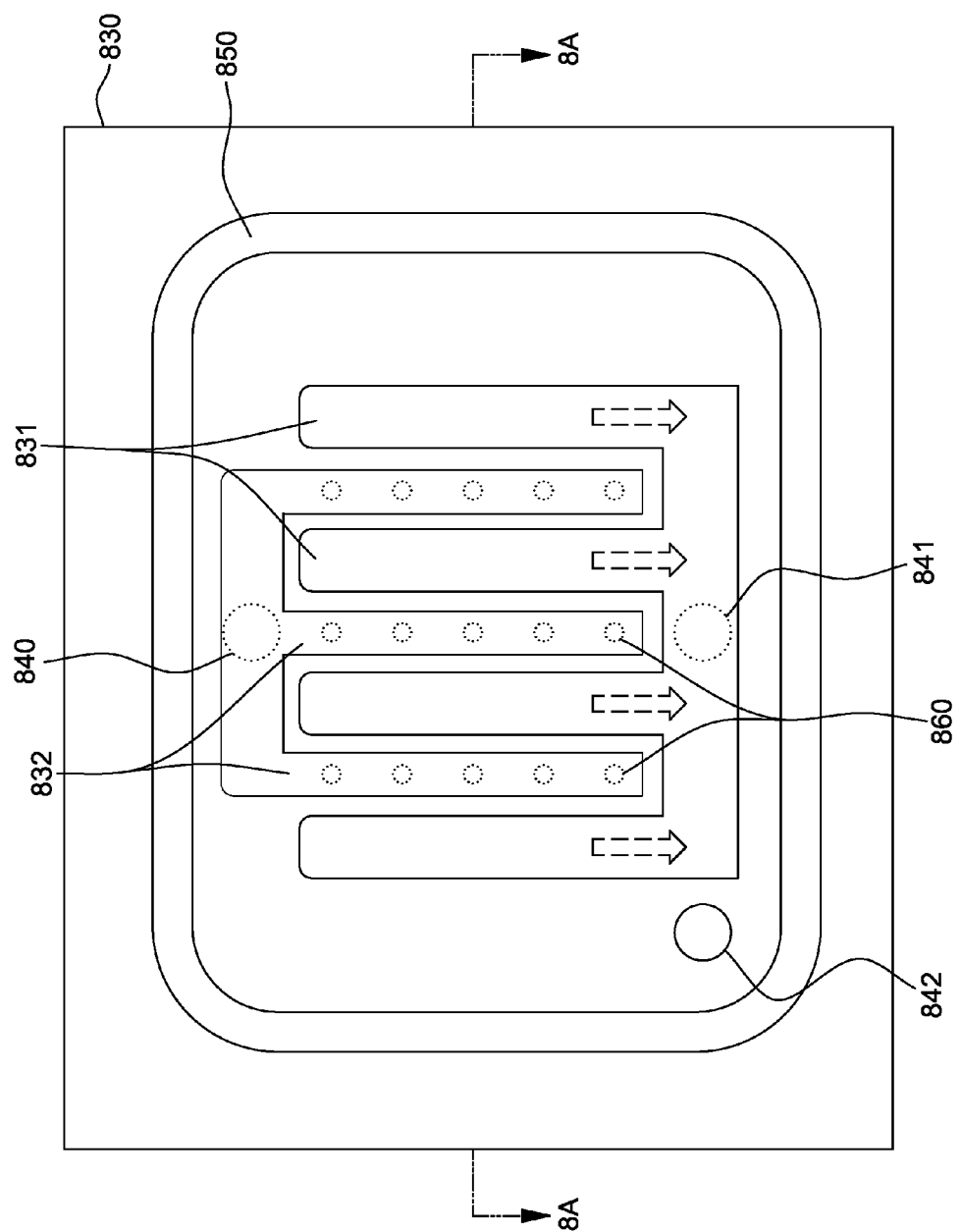
FIG. 8D is a cross-section plan view of the cooled electronic structure of FIG. 8A, taken along line 8D-8D thereof, in accordance with one or more aspects of the present invention.

Heat sink 801 is again a multilayer heat sink with a heat sink base 810, a membrane structure 820, and a heat sink cap 830, which are respectively depicted in cross-sectional plan view in FIGS. 8B-8D. Referring collectively to FIGS. 8A-8D, heat sink base 810 comprises one or more coolant-carrying channels 812, each of which may comprise a microchannel structure, such as described above. In operation, heat from the electronic component is rejected to coolant within the coolant-carrying channels in the heat sink base 810, causing boiling of the coolant.

As illustrated in FIGS. 8A & 8C, various regions of the coolant-carrying channels are capped by at least one vapor-permeable region 821 of membrane 820. As illustrated in FIGS. 8A & 8D, disposed over these regions are vapor transport channels 831 formed in heat sink cap 830. Thus, localized venting of vapor 833 directly from the coolant-carrying channels, across the vapor-permeable membrane into the vapor transport channels is provided within the heat sink. In one embodiment, membrane 820 is modified to include, in addition to the at least one vapor-permeable region 821, at least one vapor-impermeable region 822. The at least one vapor-impermeable region 822 comprises a plurality of parallel-extending digits that are interdigitated with a plurality of vapor-permeable areas of the at least one vapor-permeable region 821, as illustrated in FIG. 8C. The vapor-impermeable digits extend substantially transverse to the coolant-carrying channels 812.

In the embodiment depicted, at least one orifice 860 is provided in each of the vapor-impermeable digits where extending over a respective coolant-carrying channel. Coolant 834 is introduced into the coolant-carrying channels through orifices 860 via liquid coolant delivery channels 832, which as illustrated in FIG. 8D, are interdigitated with the vapor transport channels 831 within the heat sink cap 830. Liquid coolant delivery channels 832 are in fluid communication with a liquid coolant inlet port 840 of heat sink 801. Coolant exhaust is discharged via coolant exhaust channels 814 through a coolant exhaust outlet port 842. In this embodiment, the vapor transport channels 831 vent vapor from the heat sink through a vapor outlet port 841, as illustrated in FIG. 8D.

As with the cooled electronic structure embodiment of FIGS. 5A-5D, heat sink base 810 and heat sink cap 830 are configured to accommodate, in this embodiment, an O-ring 850 to seal coolant and vapor within the heat sink. Coolant and vapor are additionally sealed within the heat sink by the vapor-impermeable region 822 defined around the perimeter of the membrane 820, that is, where held by the heat sink base and heat sink cap, as illustrated in FIG. 8A.

In one embodiment, the heat sink base and heat sink cap are fabricated of a metal material, such as copper, the coolant comprises water, and the membrane is a vapor-permeable, liquid-impermeable membrane (except for the jet orifices), such as a vapor-permeable PTFE or polypropylene material.

Figure 9:
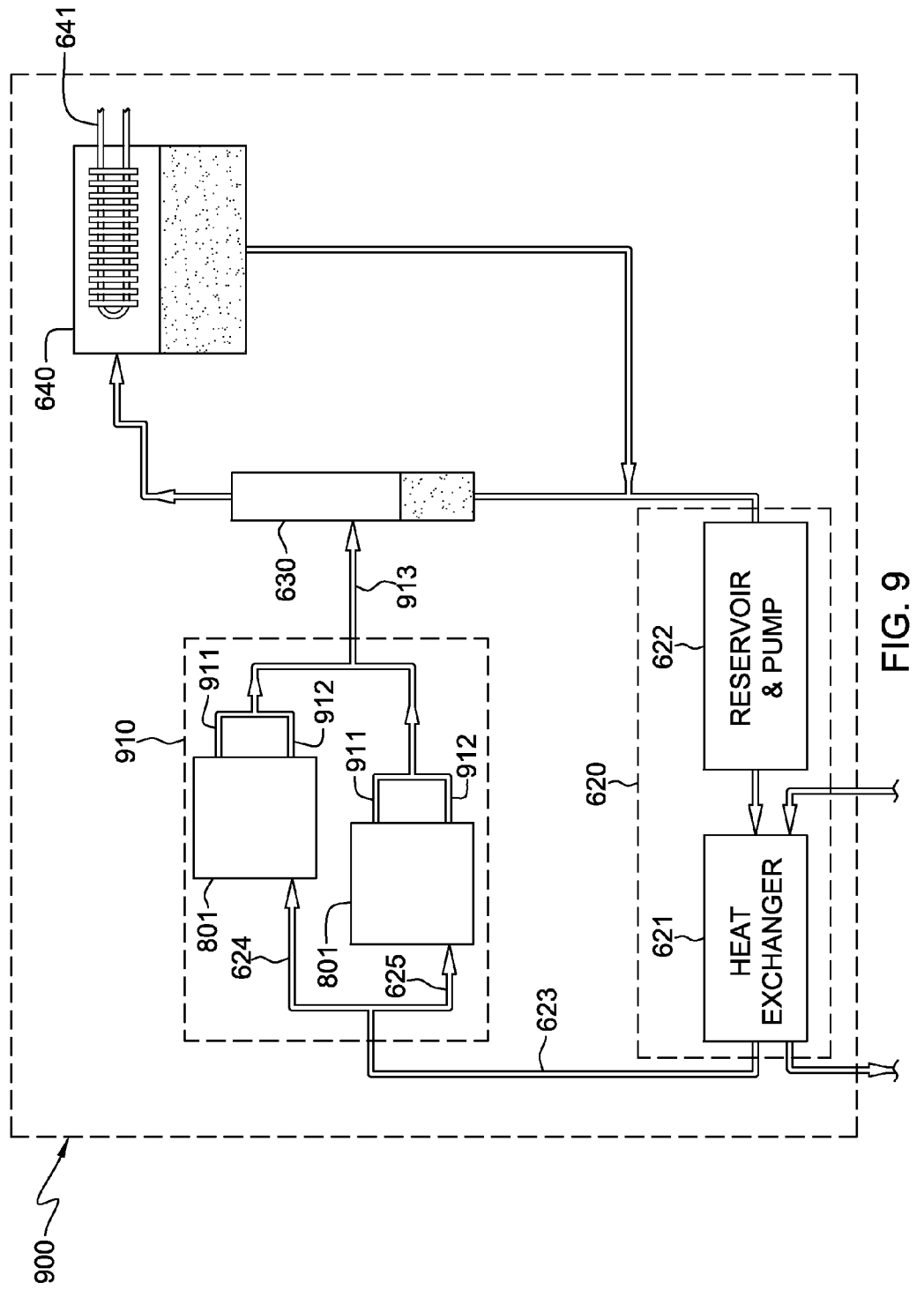
FIG. 9 is a schematic of one embodiment of a cooled electronics apparatus employing node-level merging of vapor and coolant exhaust, and rack-level vapor separation and condensing, in accordance with one or more aspects of the present invention.

FIG. 9 depicts one embodiment of a rack-level cooling apparatus comprising multiple heat sink structures, such as depicted in FIGS. 8A-8D. In this embodiment, two heat sink structures 801 are illustrated within an electronic subsystem 910, such as a node of an electronics rack 900. The cooling apparatus includes a modular cooling unit 620, such as described above. Modular cooling unit 620 includes a liquid-to-liquid heat exchanger 621 and a reservoir with an associated pump 622 for providing cooled liquid coolant via a coolant supply manifold 623 and node-level supply lines 624, 625 to the coolant inlet ports of the respective heat sinks 801. In the embodiment of FIGS. 8A-8D, the vented vapor and the coolant exhaust are discharged separately via, for example, coolant exhaust lines 911, 912 extending from each heat sink 801. In the embodiment depicted, these exhaust lines are merged within the electronic subsystem or node 910 into a single, two-phase coolant outlet line 913, which is coupled in fluid communication with phase separation manifold 630. Phase separation manifold 630 comprises a buoyancy-driven phase separator, with the coolant exhaust comprising (in one mode of operation) both vapor and liquid. Vapor within the manifold rises to vapor condenser 640 disposed in the upper region of electronics rack 900. In one embodiment, the condenser is liquid-cooled 641, for example, via facility coolant. The resultant condensate is returned to the modular cooling unit 620 to repeat the process.

One advantage of the heat sink design of FIGS. 8A-9 over the heat sink design of FIGS. 5A-7 is that the vapor reintroduction into the coolant stream is at the node level, which reduces the risk of vapor channel flooding by the coolant exhaust.

Figure 10:
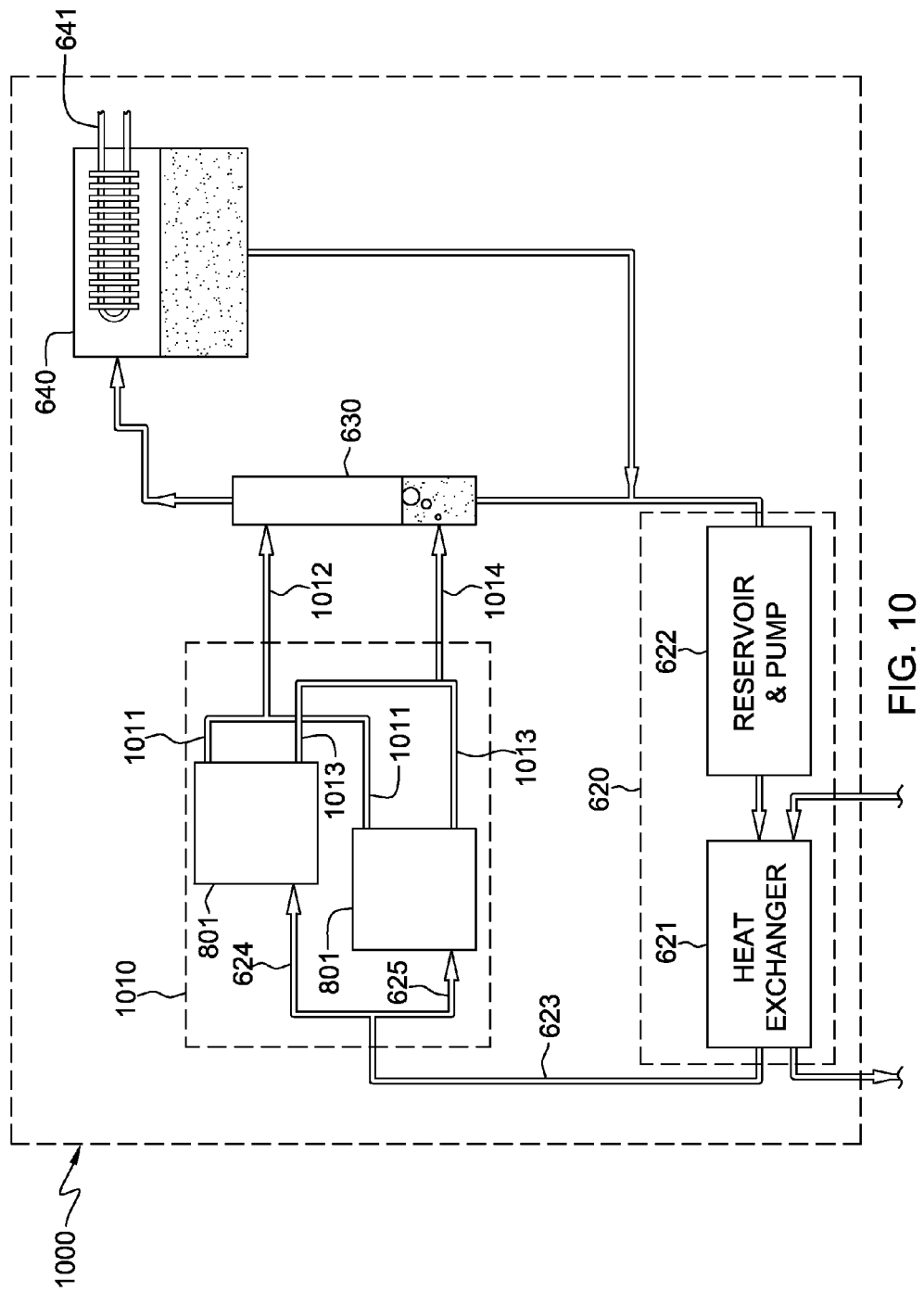
FIG. 10 is a schematic view of an alternate embodiment of a cooled electronics apparatus comprising multiple cooled electronic structures and rack-level merging of vapor and coolant exhaust, as well as rack-level vapor separation and condensing, in accordance with one or more aspects of the present invention.

FIG. 10 depicts another embodiment of a rack-level cooling apparatus comprising multiple heat sink structures, such as depicted in FIGS. 8A-8D. In this embodiment, two heat sink structures 801 are again illustrated within an electronic subsystem 1010, such as a node of an electronics rack 1000. The cooling apparatus includes a modular cooling unit 620, such as described above. Modular cooling unit 620 includes a liquid-to-liquid heat exchanger 621 and a reservoir with an associated pump 622 for providing cooled liquid coolant via a coolant supply manifold 623 and node-level supply lines 624, 625 to the coolant inlet ports of the respective heat sinks 801. In the embodiment of FIG. 10, the vapor outlet ports of the heat sinks are coupled to vapor vent lines 1011, which are connected in fluid communication at the node level into a single vapor vent outlet line 1012, which is also connected in fluid communication with phase separation manifold 630. Similarly, the coolant exhaust outlet ports of the heat sinks 801 are connected to respective coolant exhaust lines 1013, which are merged within the node into a single coolant exhaust outlet line 1014 that is coupled in fluid communication with phase separation manifold 630. As noted above, phase separation manifold 630 is a buoyancy-driven phase separator, with the coolant exhaust comprising (in one mode of operation) both vapor and liquid. Vapor within the manifold rises to the vapor condenser 640 disposed in the upper region of electronics rack 1000. In one embodiment, the condenser is liquid-cooled 641, for example, via facility coolant. The resultant condensate is returned to the modular cooling unit 620 to repeat the process.

Figure 11:
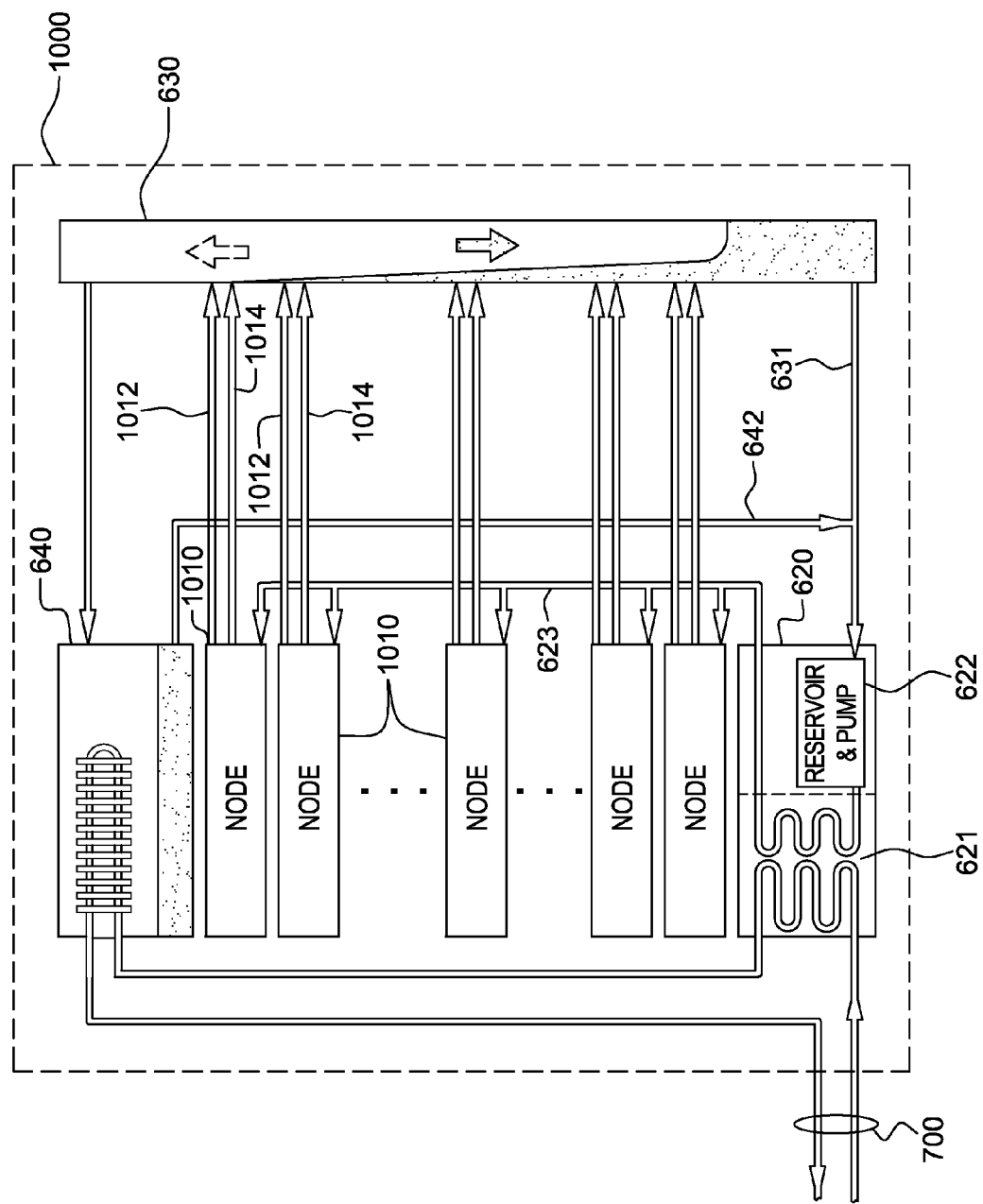
FIG. 11 is a more detailed schematic view of the cooled electronics apparatus of FIG. 10, in accordance with one or more aspects of the present invention.

FIG. 11 depicts a more detailed embodiment of the cooling apparatus and electronics rack of FIG. 10. In this embodiment, heat exchanger 621 of modular cooling unit 620 is shown to comprise a liquid-to-liquid heat exchanger, with the facility coolant loop 700 providing facility coolant to the liquid-to-liquid heat exchanger, as well as to the vapor condenser 640. In the embodiment of FIG. 11, the phase separation manifold 630 is shown to comprise an elongate, vertically-oriented structure, such as a long tube with a relatively large internal diameter. Multiple nodes 1010 are illustrated in FIG. 11, with each node receiving liquid coolant via coolant supply manifold 623, and rejecting vapor via vapor outlet line 1012, and coolant via coolant exhaust outlet line 1014 to phase separation manifold 630. Vapor within the manifold rises to vapor condenser 640 disposed in an upper region of electronics rack 1000. In one embodiment, the condenser is liquid-cooled, for example, via facility coolant flowing through facility coolant loop 700. The resultant condensate is returned via a condensate return line 642 to the liquid coolant return line 631 coupling phase separation manifold 630 to modular cooling unit 620, to repeat the process.

Figure 12A:
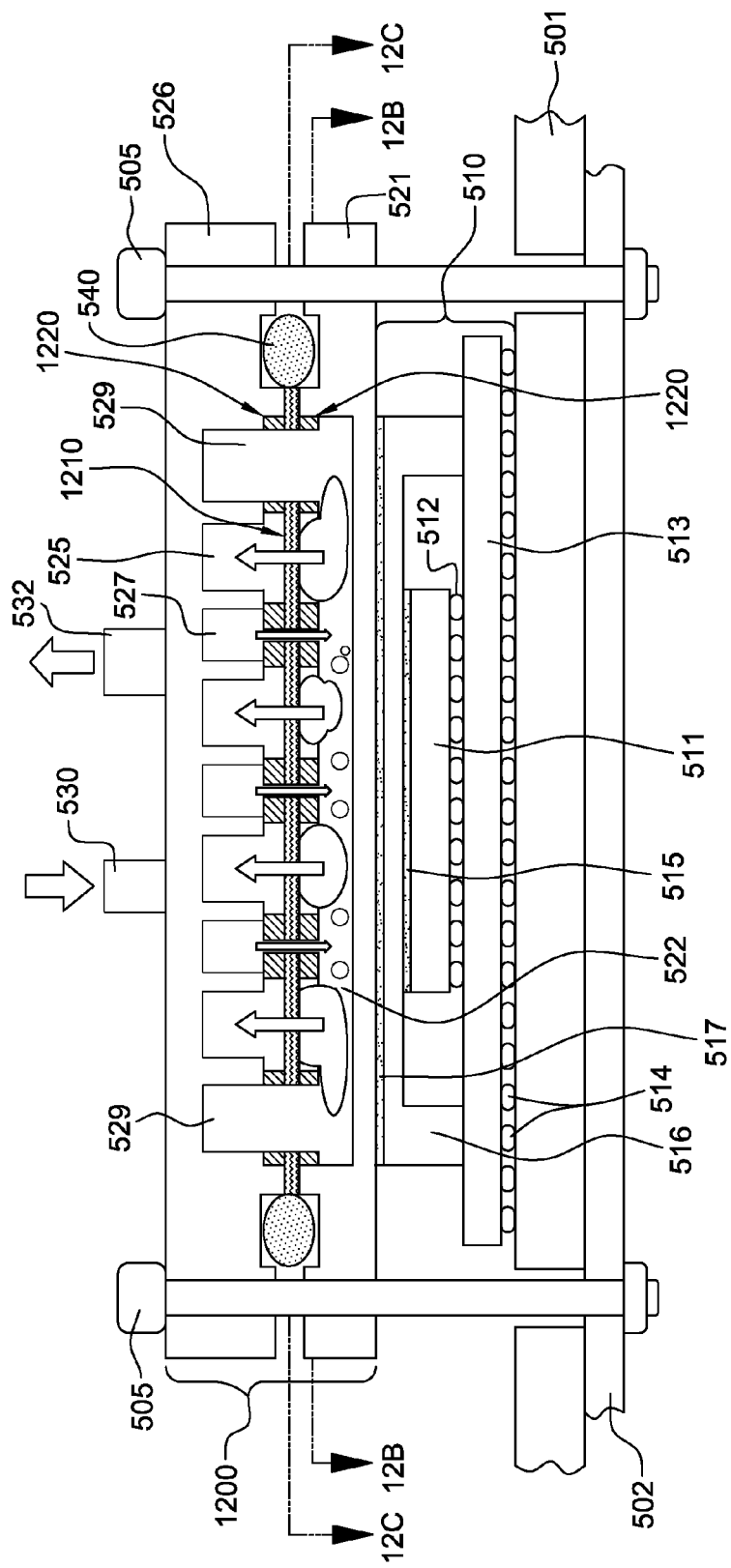
FIG. 12A is a cross-sectional elevational view of another embodiment of a cooled electronic structure comprising a heat-generating electronic component and a heat sink with a vapor-permeable membrane, and taken along line 12A-12A in FIG. 12B, in accordance with one or more aspects of the present invention.
Figure 12B:
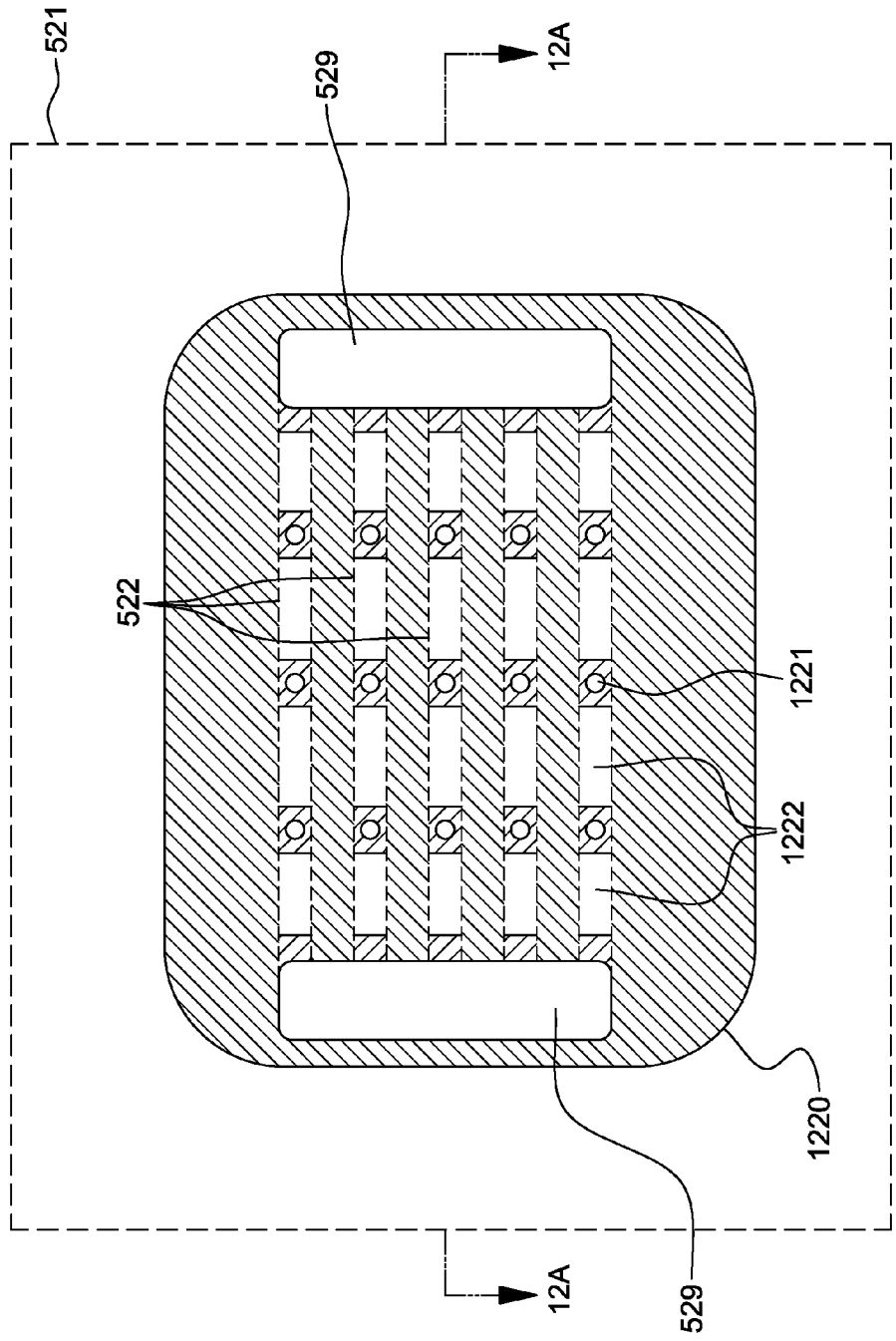
FIG. 12B is a cross-sectional plan view of the cooled electronic structure of FIG. 12A, taken along line 12B-12B thereof, in accordance with one or more aspects of the present invention.
Figure 12C:
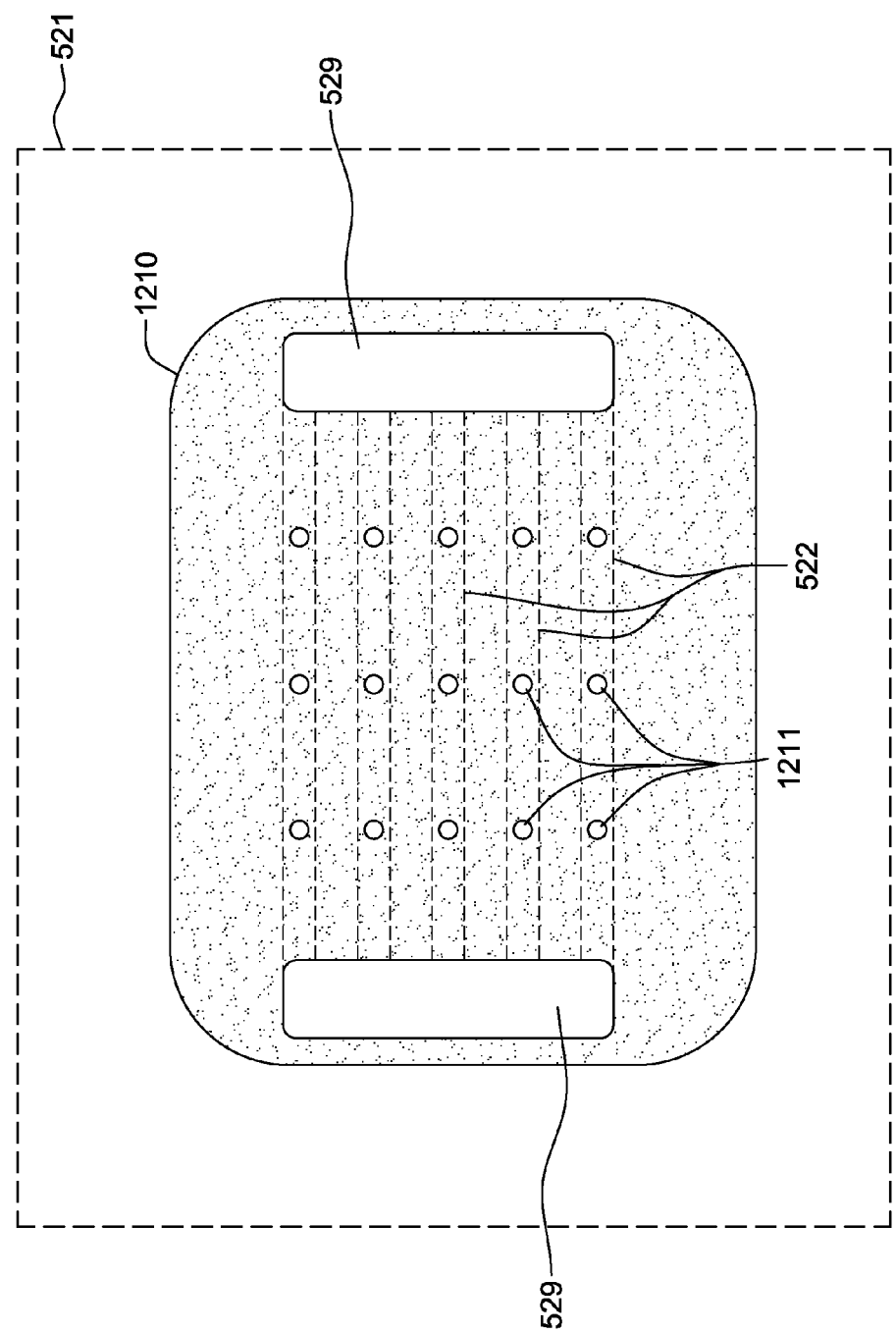
FIG. 12C is a cross-sectional plan view of the cooled electronic structure of FIG. 12A, taken along line 12C-12C thereof, in accordance with one or more aspects of the present invention.

FIGS. 12A-12C depict another embodiment of a cooled electronic structure, in accordance with one or more aspects of the present invention. The cooled electronic structure of FIGS. 12A-12C is similar to cooled electronic structure 500 of FIGS. 5A-5D, except that the single-layer membrane 523 of FIGS. 5A-5D is replaced by a multilayer structure comprising (in one embodiment) a vapor-permeable membrane 1210 positioned between two masking plates 1220, as illustrated in FIG. 12A.

Specifically, as shown in FIG. 12A, the cooled electronic structure includes, in this embodiment, electronic component 510, such as an electronic module, mounted to a printed circuit board 501, with an associated back plate 502. Heat sink 1200 is mechanically coupled via securing mechanisms 505 to back plate 502 of printed circuit board 501, which provide compressive loading of heat sink 1200 to electronic component 510. Electronic component 510 includes, in this embodiment, integrated circuit chip 511 connected to chip carrier or substrate 513 via a first plurality of solder ball connections 512. Substrate 513 is electrically connected to printed circuit board 501 via a second plurality of solder ball connections 514. A thermally conductive cap 516 is interfaced to integrated circuit chip 511 via first thermal interface material 515, and to the heat sink 1200 via second thermal interface material 517, which may be the same or different interface materials.

Heat sink 1200 is again a multilayer heat sink, with a heat sink base 521, a multilayer membrane structure comprising masking plates 1220, and vapor-permeable membrane 1210, and a heat sink cap 526. By way of example, embodiments of masking plate 1220 and vapor-permeable membrane 1210 are respectively depicted in cross-sectional plan view in FIGS. 12B & 12C.

Referring collectively to FIGS. 12A-12C, heat sink base 521 comprises one or more coolant-carrying channels 522, each of which may comprise a microchannel structure, such as described above. In operation, heat from the electronic component is rejected to coolant within the coolant-carrying channels in the heat sink base 521, causing (in one mode) boiling of the coolant.

As illustrated in FIGS. 12A-12C, various regions of the coolant-carrying channels 522 are capped by vapor-permeable membrane 1210, which is positioned in between masking plates 1220 and exposed to the coolant-carrying channels via open regions 1222 in masking plates 1220. These exposed regions of vapor-permeable membrane 1210 align to vapor transfer channels 525, which vent vapor egressing from the coolant-carrying channels, as explained above.

Jet orifices or nozzles are defined in the multi-layer membrane structure via aligned through-holes 1221 in masking plates 1220, and through-holes 1211 in vapor-permeable membrane 1210. As explained above, these jet orifices inject coolant from liquid coolant delivery channels 527 into the coolant-carrying channels 522 in heat sink base 521.

In one embodiment, masking plates 1220 comprise metal masking plates, which may be epoxied, soldered or press-fitted to heat sink base 521 and heat sink cap 526. Additionally, masking plates 1220 may be epoxied to the vapor-permeable membrane 1210 for better sealing. Note also that the open regions 1222 in the masking plate 1220 exposed to the coolant-carrying channels 522 operate as vapor traps, where vapor collects between the channels and the membrane. This further facilitates egress of the vapor across the membrane into the vapor transport channels 525. Note further, that in the depicted multilayer membrane structure embodiment, the vapor-permeable membrane of FIGS. 12A & 12C need not have a vapor-impermeable region, such as in the embodiments of FIGS. 5A-11, described above. Note also that other multilayer membrane structure embodiments may alternatively be employed with a heat sink structure as described herein. For example, a single masking plate could be employed with the vapor-permeable membrane, if desired.

Those skilled in the art will note from the above discussion that the heat sink structures described herein include a heat sink base which comprises one or more coolant-carrying channels. In one embodiment, these coolant-carrying channels have sub-millimeter hydraulic diameters, and also are referred to herein as "microchannels". Such small channels help increase the surface area, as well as the single-phase heat transfer coefficient of the coolant within the channels. The channels can be made via chemical etching or mechanical methods, such as skiving or end-milling. In one embodiment, the heat sink is fabricated of copper, due to its high heat transfer coefficient and relatively simple machineability. However, other materials, such as aluminum and silicon are also suitable, though may have disadvantages in terms of thermal conductivity, fragility and machineability.

The second layer of the heat sink comprises a vapor-permeable membrane, such as a porous, hydrophobic membrane, in the case where the coolant comprises water. Examples of micro/nano-porous, natively hydrophobic membranes include polypropylene, PTFE, and nylon. Natively hydrophilic materials, such as porous glass, porous silicon, porous aluminum and porous organic materials could also be used, but require a liquid-phobic coating to prevent liquid from leaking into the vapor channels. The porous membrane is prepared such that the regions with the nozzles or orifices, as well as the edges of the membrane, are hardened and non-porous to provide better nozzle definition as well as edge sealing. The membrane can be patterned using a variety of techniques, such as hot press (wherein a heated master is pressed onto the porous membrane to plastically deform it and close the pores in the desired regions), laminating with a non-porous material (one example of which is laminated porous PTFE, where the laminate is made of non-porous polypropylene), or epoxy/photoresist infiltration (where epoxy could be used to selectively close the pores and provide additional mechanical stiffness in desired regions).

In an alternate embodiment, the second layer of the heat sink might comprise a multilayer membrane structure, for example, such as depicted in FIGS. 12A-12C, and described above. In such a multilayer structure, the membrane may be a vapor-permeable membrane, for instance, a porous, hydrophobic membrane, in the case where the coolant comprises water. Additionally, the masking plate may be fabricated of various vapor-impermeable materials, with metal being one example.

The third layer of the heat sink, that is, the heat sink cap, comprises relatively larger liquid and vapor channels which help distribute the fluid from and to the inlet and outlet ports of the heat sink. In order to minimize the pressure drop in these channels, the hydraulic diameter is maintained relatively large. A large hydraulic diameter also reduces the pressure drop when the vented vapor is reintroduced to the coolant effluent (which may be a two-phase effluent) at the heat sink level. The heat sink cap can be made of copper or aluminum or any other material with a similar coefficient of thermal expansion (CTE) as that of the heat sink base to avoid excessive thermal stresses developing.

The coolant (or working fluid) should be compatible with the selected membrane, thus requiring specific fluid/membrane combinations. Examples, of coolants (or working fluids) include: water at sub-ambient pressures, dielectric fluids at atmospheric pressure, and refrigerants at higher pressures.

The above-described heat sinks, cooled electronic structures and cooled electronic apparatuses employ a rack-level condenser to condense the vapor back into a liquid to be re-circulated. Rack-level vapor separation and condensation may not always be practical due to cost, complexity and the need to minimize the two-phase flow pressure drop in the connecting tubing. Disclosed hereinbelow therefore (with reference to FIGS. 13A-18) are various approaches to condensing the generated vapor within the heat sink structure itself, which advantageously eliminates the need for rack-level condensation hardware, and also advantageously allows for the heat sink structure with incorporated local vapor removal and condensation to be employed in existing single-phase, liquid-cooling architectures.

Generally stated, in the heat sink structures of FIGS. 13A-18, the heat sink includes a thermally conductive structure comprising one or more coolant-carrying channels and one or more vapor-condensing channels. A membrane is disposed between the coolant-carrying channel(s) and the vapor-condensing channel(s). This membrane includes a vapor-permeable region which overlies portions of the coolant-carrying channel(s) and facilitates removal of vapor from the coolant-carrying channel(s) to the vapor-condensing channel(s). One or more coolant inlets to the heat sink are coupled to provide a first coolant flow to the coolant-carrying channel(s) and a second coolant flow to facilitate vapor condensation within the vapor-condensing channel(s).

More particularly, liquid coolant is pumped from the modular cooling unit(s) to the individual nodes of the electronics rack, where node-level plumbing splits the flow to the different cooled electronic structures. Within the heat sink, a first liquid coolant flow flows through the microchannels in the heat sink and boils as it absorbs heat from the associated electronic component(s). The vapor generated is locally vented through, in one embodiment, a porous, hydrophobic membrane that caps the coolant-carrying channels. This vented vapor is then condensed employing a second liquid coolant flow. Condensation is facilitated either through direct contact with a diverted fraction of the sub-cooled liquid coolant, or indirect condensation through the use of, for example, facility chilled water plumbed to a condensing cap structure of the heat sink (in one embodiment). The advantages of local vapor removal include: a reduced, two-phase flow pressure drop and pumping power; a lower, more uniform saturation temperature within the heat sink; improved heat transfer coefficients and reduced module thermal resistance due to phase change and improved wetting by the liquid coolant; and, a reduced possibility of flow instabilities which could lead to premature dryout.

Local vapor removal within the heat sink structure facilitates a reduced pressure drop in the coolant channels, tubings and manifolds of the cooling apparatus due to the presence of a condensed, single-phase liquid flow instead of a two-phase mixture flow, as in a rack-level condensing approach. Local vapor condensing also eliminates the need for rack-level vapor separation and condensation. Additionally, local vapor condensing, in the case of a single fluid, may be accomplished by direct contact condensing of the vapor with a portion of the liquid coolant, which provides the possibility of incorporating the cooling solution within existing, single-phase platforms since the rack-level architecture would be similar. Also, in the case of direct contact condensing, such as described below, the potential for fine-tuning cooling performance through the use of electronic valving is provided, wherein liquid flow rates to the coolant-carrying channels versus vapor-condensing channels may be dynamically adjusted. Alternatively, in the case of a two-fluid implementation, an indirect condensation scheme may employ a condensing cap structure, and a smaller heat sink coolant flow rate. A smaller heat sink coolant flow rate may be sufficient since all the flow is sent directly to the heat sink structure for flow boiling.

FIGS. 13A-13E depict one embodiment of a cooled electronic structure, generally denoted 1300, in accordance with one or more aspects of the present invention. As noted, this cooled electronic structure comprises one embodiment of a flow boiling, vapor-venting heat sink with module-level condensation.

Unless otherwise indicated, cooled electronic structure 1300 is similar to the above-described cooled electronic structures, except that the layers that make up heat sink 1301 of FIGS. 13A-13E are modified from the layers that make up the above-described heat sinks of FIGS. 5A-5D and 8A-8D. The electronic component 510, printed circuit board 501, with associated back plate 502, and securing mechanisms 505, are substantially the same as described above in connection with the cooled electronic structures of FIGS. 5A-5D and 8A-8D.

Figure 13A:
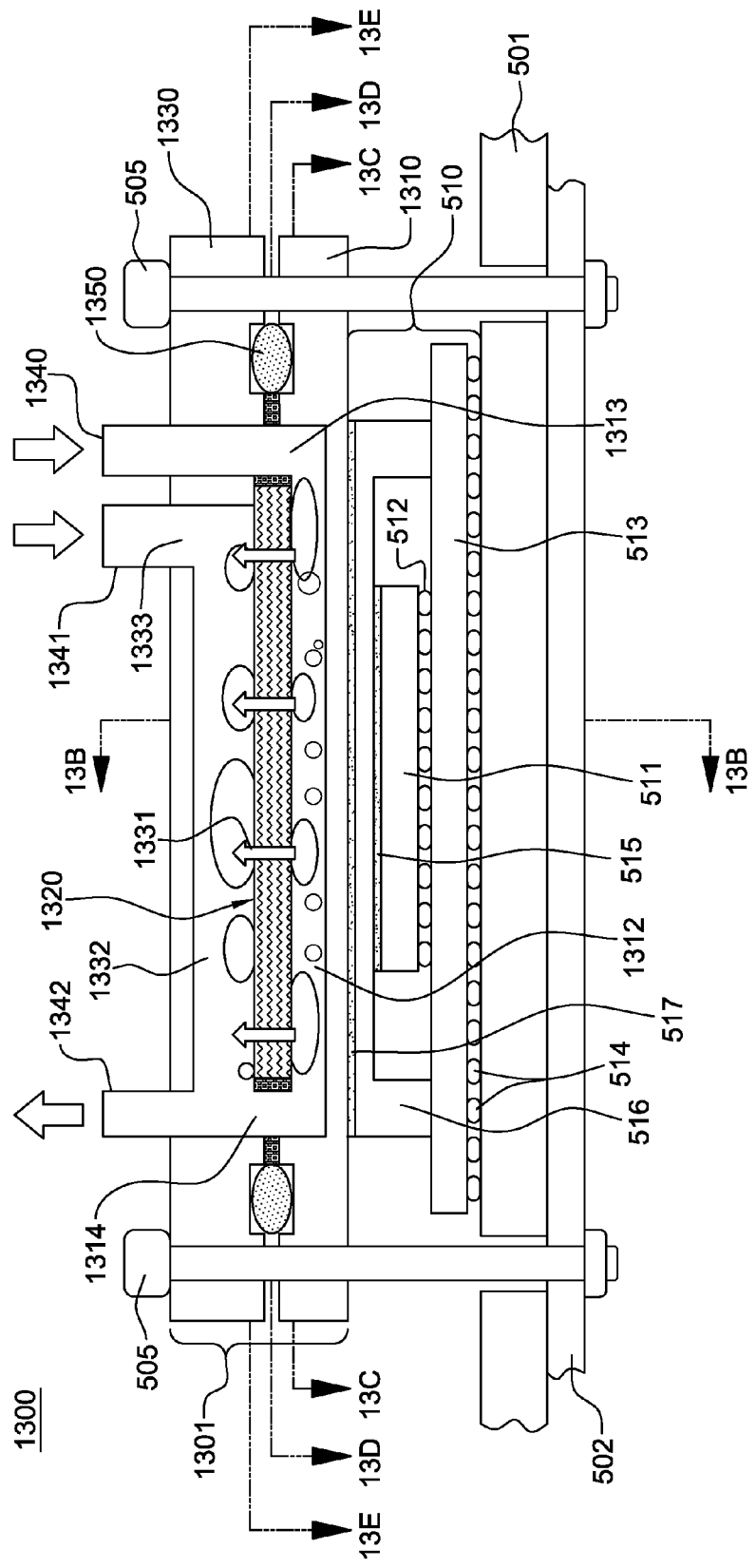
FIG. 13A is a cross-sectional elevational view of another embodiment of a cooled electronic structure, taken along line 13A-13A in FIG. 13B, in accordance with one or more aspects of the present invention.
Figure 13B:
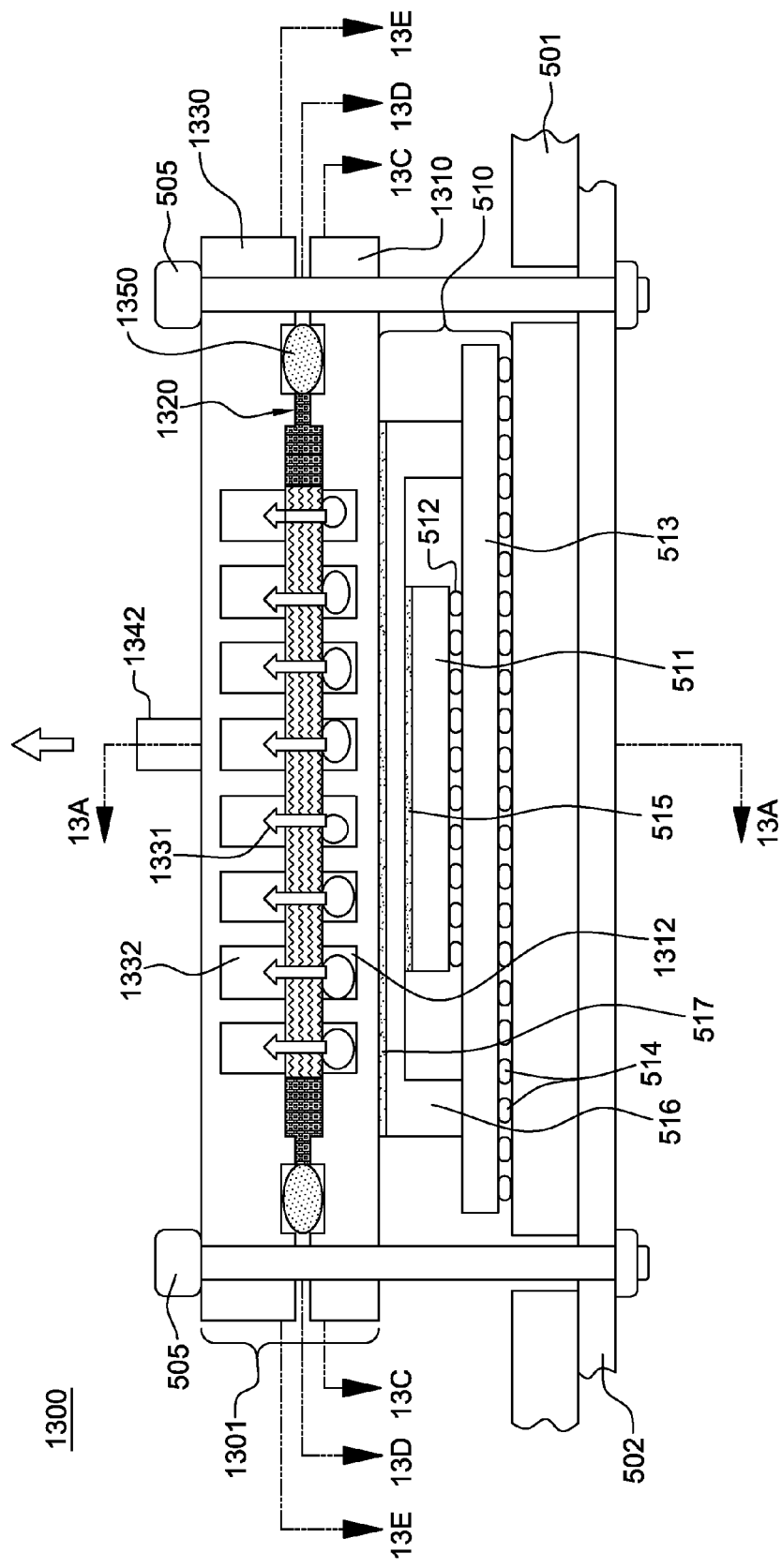
FIG. 13B is a cross-sectional elevational view of the cooled electronic structure of FIG. 13A, taken along line 13B-13B thereof, in accordance with one or more aspects of the present invention.
Figure 13C:
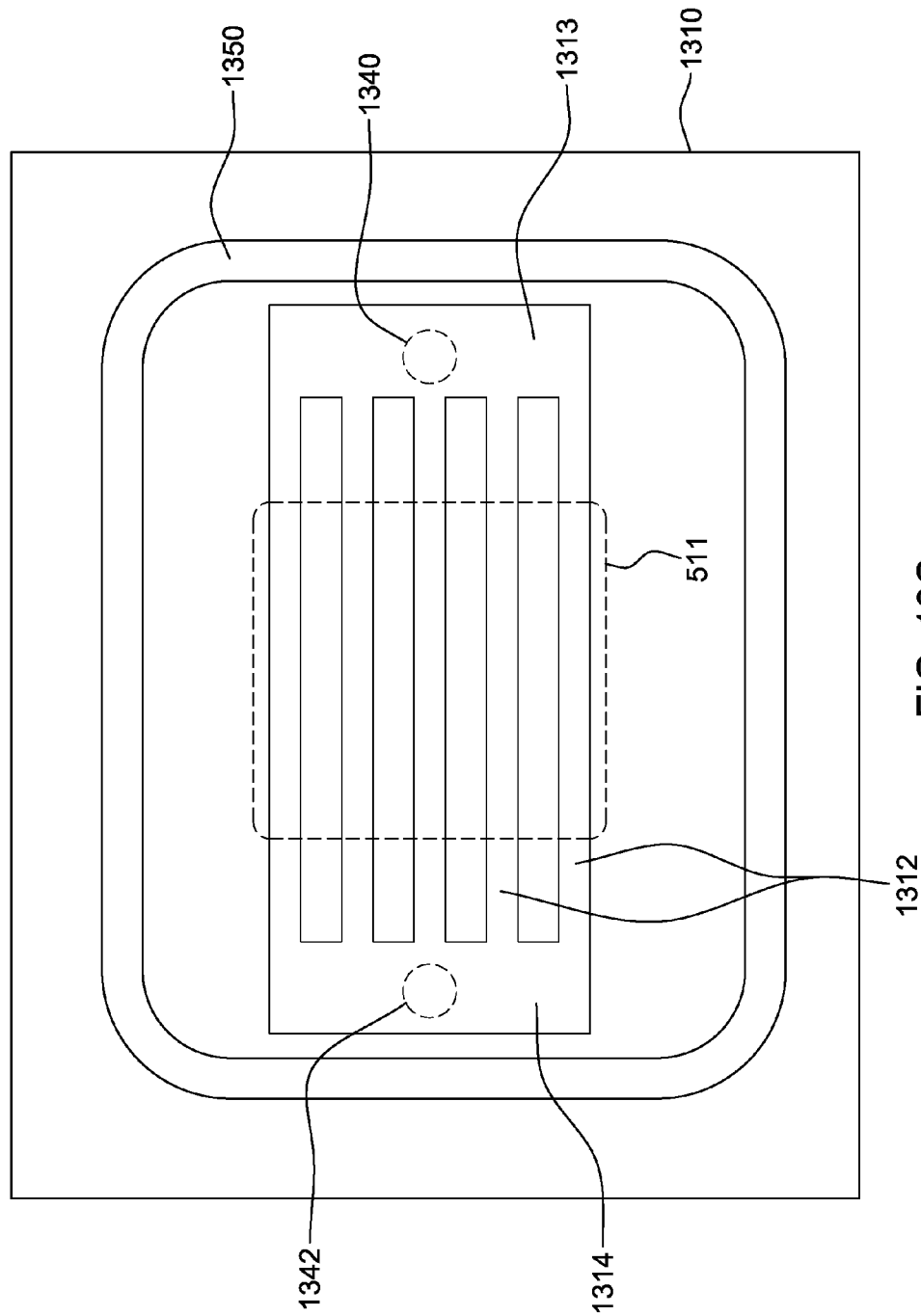
FIG. 13C is a cross-sectional plan view of the cooled electronic structure of FIG. 13A, taken along line 13C-13C thereof, in accordance with one or more aspects of the present invention.
Figure 13D:
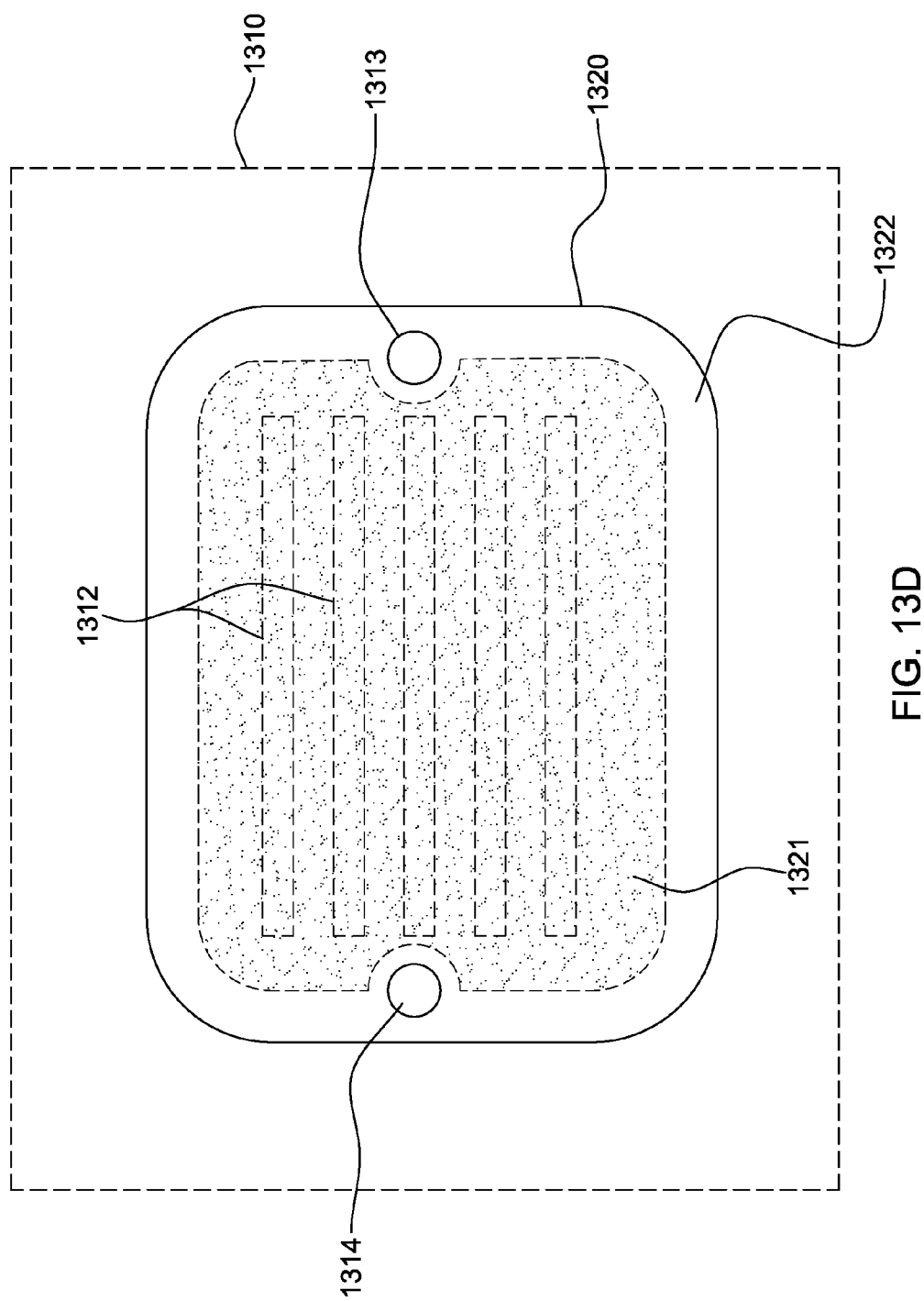
FIG. 13D is a cross-sectional plan view of one embodiment of the membrane structure of the cooled electronic structure of FIG. 13, taken along line 13D-13D thereof, in accordance with one or more aspects of the present invention.
Figure 13E:
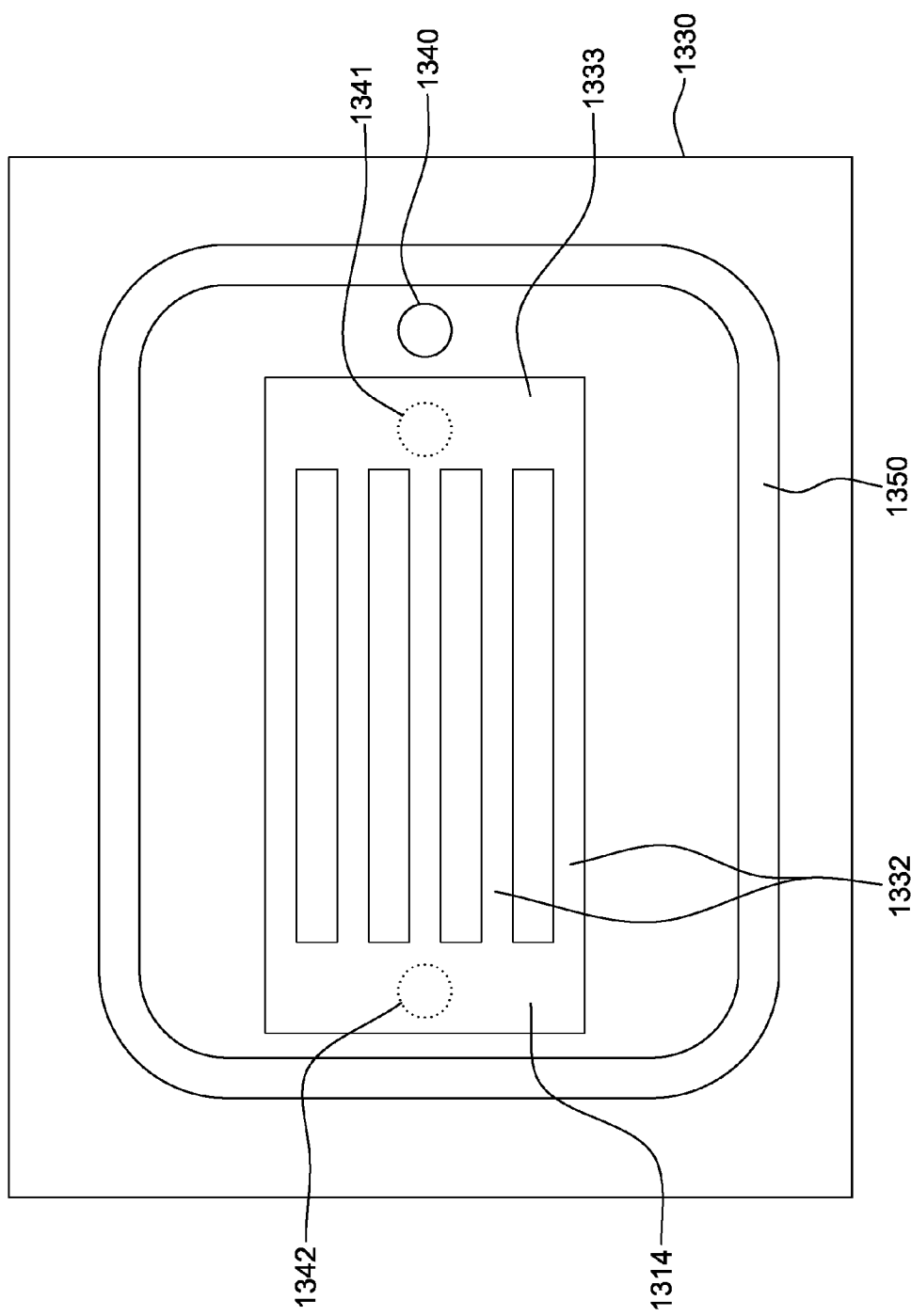
FIG. 13E is a cross-sectional plan view of the cooled electronic structure of FIG. 13A, taken along line 13E-13E thereof, in accordance with one or more aspects of the present invention.

Referring to heat sink 1301, a multilayer heat sink is provided which includes a heat sink base 1310, a membrane structure 1320, and a heat sink cap 1330, embodiments of which are respectively depicted in cross-sectional plan view in FIGS. 13C-13E. Referring collectively to FIGS. 13A-13E, heat sink base 1310 comprises one or more coolant-carrying channels 1312, each of which may comprise a microchannel structure, such as described above. In operation, heat from the electronic component is rejected to coolant within coolant-carrying channels 1312 in the heat sink base 1310 causing (in one mode) boiling of the coolant. Coolant is introduced through a first coolant inlet 1340 and a large hydraulic diameter, liquid coolant inlet manifold 1313 to the coolant-carrying channels 1312. Coolant exhaust is discharged via a coolant exhaust manifold 1314 through a coolant outlet port 1342.

As illustrated in FIGS. 13A, 13B & 13D, various regions of coolant-carrying channels 1312 are capped by at least one vapor-permeable region 1321 of membrane 1320, and as illustrated in FIGS. 13A, 13B & 13E, the heat sink cap 1330 includes multiple vapor-condensing channels 1332, which substantially align over coolant-carrying channels 1312 of heat sink base 1310, with the vapor-permeable region 1321 of membrane 1320 separating the coolant-carrying (or flow boiling) channels from the vapor-condensing channels. Thus, localized venting of vapor 1331 directly from the coolant-carrying channels, across the vapor-permeable membrane into the vapor-condensing channels is provided within the heat sink. In one embodiment, membrane 1320 is modified to include a vapor-impermeable region 1322 around the perimeter of the membrane 1320, that is, where held by the heat sink base and heat sink cap, as illustrated in FIGS. 13A & 13B. Further, heat sink base 1310 and heat sink cap 1330 are configured to accommodate, in this embodiment, an O-ring 1350 to seal coolant and vapor within the heat sink.

In this implementation, condensation of vapor within the vapor-condensing channels is facilitated by providing, through a second coolant inlet 1341 and a second coolant inlet manifold 1333 within heat sink cap 1330, a liquid coolant flow within the vapor-condensing channels 1332 for direct condensing of vapor before the vapor exhausts through the coolant exhaust manifold 1314 extending from the heat sink base through the heat sink cap to the coolant outlet port 1342. In one embodiment, liquid coolant flows introduced via the first liquid coolant inlet 1340 and the second the liquid coolant inlet 1341 are fractional coolant flows of a cooled coolant flow through a coolant loop of the respective rack-level cooling apparatus. In one embodiment, the heat sink base and heat sink cap may be fabricated of a metal material, such as copper, the coolant may comprise water, and the membrane may be a vapor-porous, liquid-impermeable membrane, such as vapor-porous PTFE or polypropylene material.

As explained further below with reference to FIGS. 16A & 16B, liquid coolant supplied to a node of a multi-node electronics rack may be divided among the cooled electronic structures within that node, and then at the input of a particular heat sink, be further split into a first fractional flow of liquid coolant and a second fractional flow of liquid coolant, with the first fractional flow of liquid coolant being introduced (in one embodiment) to the coolant-carrying channels, and the second fractional flow of liquid coolant being introduced to the vapor-condensing channels. During low heat flux operation, the first fractional flow and second fractional flow of liquid coolant pass through the respective coolant-carrying and vapor-condensing channels, and are recombined in the coolant exhaust manifold for exhausting through the common coolant outlet port. When the heat flux is increased, the liquid diverted to the coolant-carrying channels begins to boil. Due to the pressure developed in the coolant-carrying channels due to vaporization, and the low resistance to flow of vapor across the vapor-permeable membrane, the vapor flows through the membrane into the comparatively larger vapor-condensing channels. Within the vapor-condensing channels, the vapor encounters the cooler, second fractional flow of liquid coolant, and condenses through direct contact with the liquid coolant. This results in a relatively lower vapor quality in both the coolant-carrying channels and the vapor-condensing channels, and results in a smaller pressure drop in both channel types. Non-vented vapor flowing in the coolant-carrying channels may subsequently condense when the second fractional flow of liquid coolant merges with the first fractional flow of liquid coolant in the coolant exhaust manifold, as illustrated in FIGS. 13A-13E. This results in a substantially single-phase liquid coolant exiting the heat sink structure.

Figure 14A:
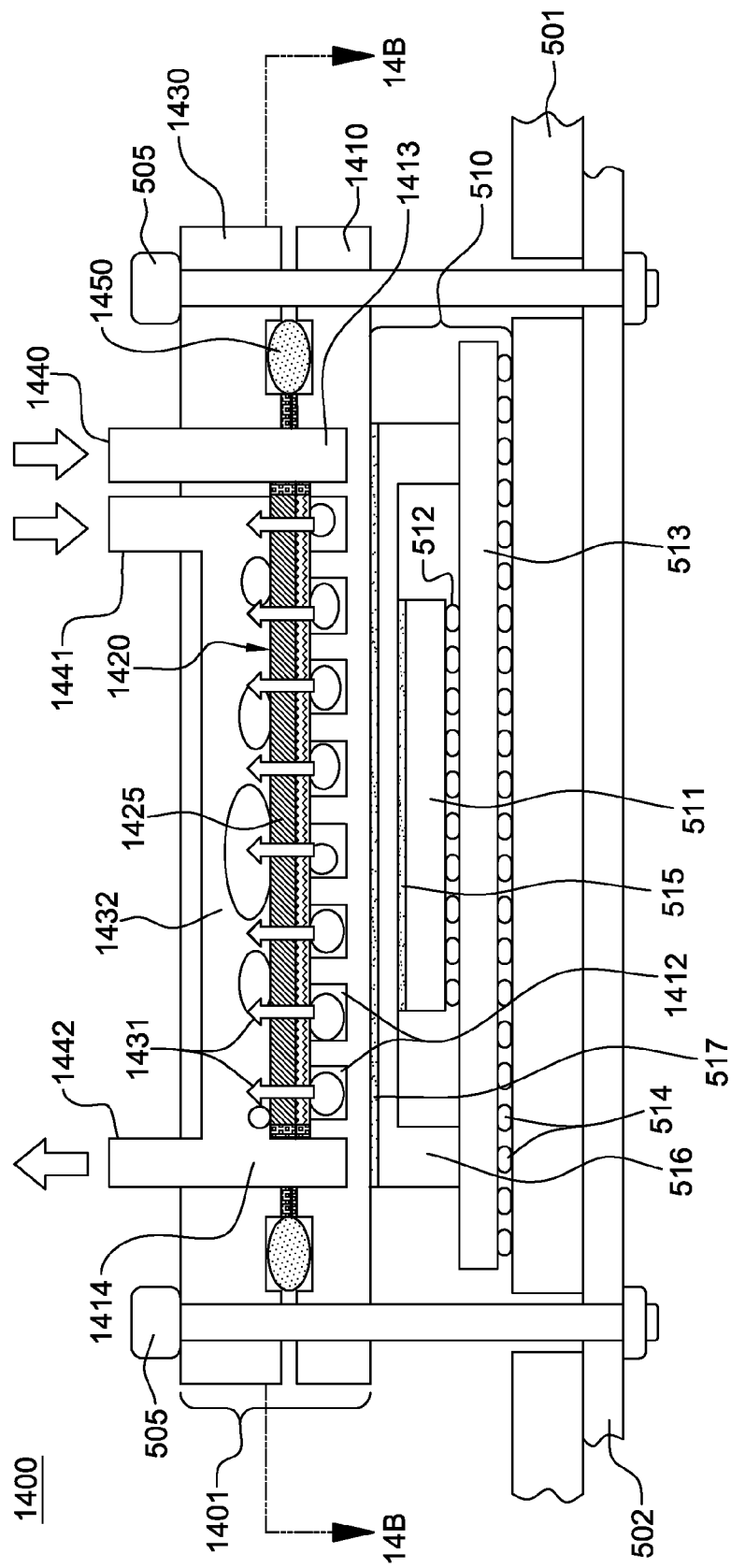
FIG. 14A is a cross-sectional elevational view of another embodiment of a cooled electronic structure, taken along line 14A-14A in FIG. 14B, in accordance with one or more aspects of the present invention.
Figure 14B:
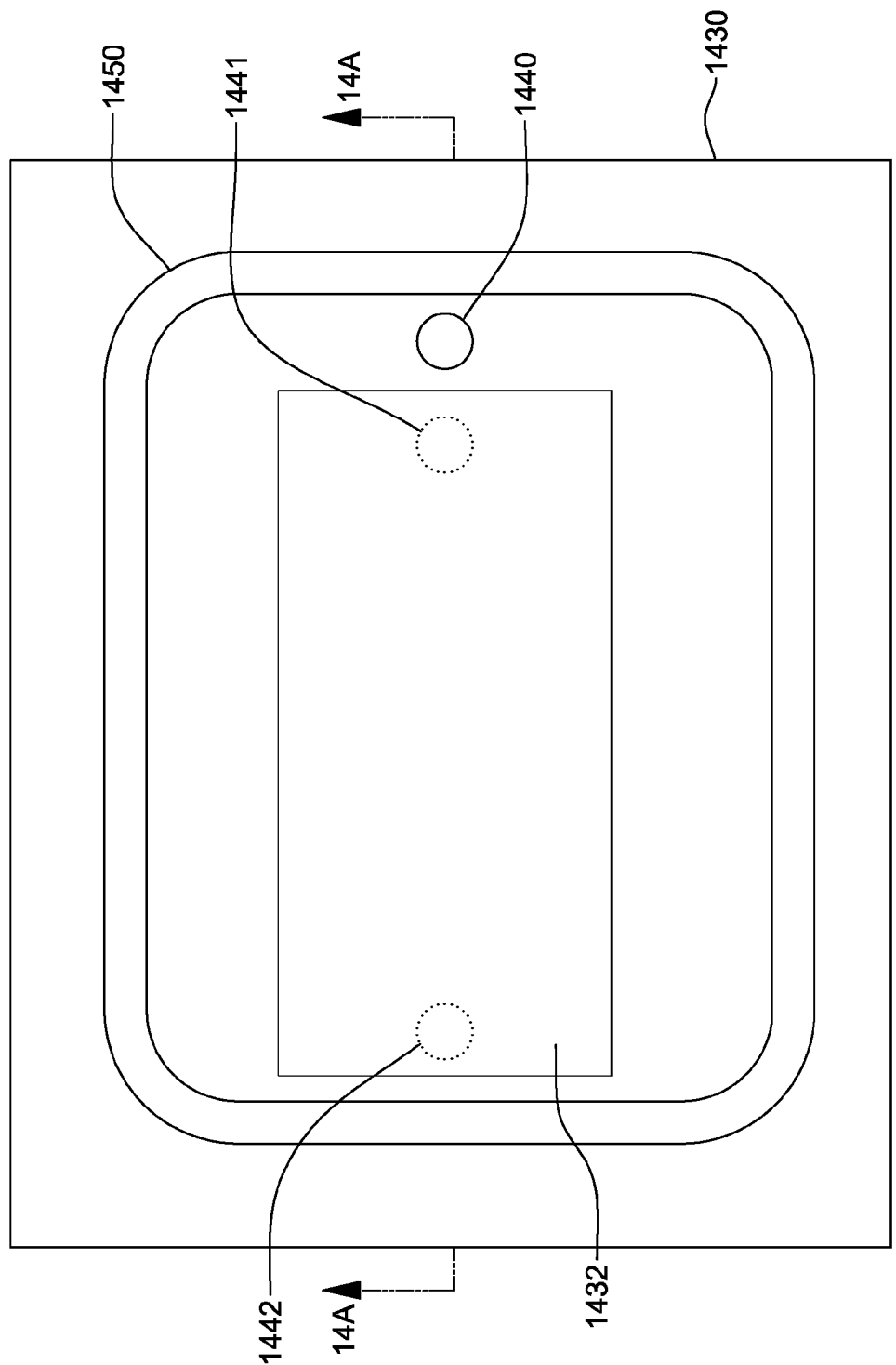
FIG. 14B is a cross-sectional plan view of the cooled electronic structure of FIG. 14A, taken along line 14B-14B thereof, in accordance with one or more aspects of the present invention.

FIGS. 14A & 14B depict another embodiment of a cooled electronic structure 1400, in accordance with one or more aspects of the present invention. Cooled electronic structure 1400 is similar to cooled electronic structure 1300 of FIGS. 13A-13E, except that the plurality of vapor-condensing channels of the heat sink structure 1301 of FIGS. 13A-13E are replaced by a single, larger vapor-condensing channel (or chamber) 1432 in the heat sink structure 1401 of FIGS. 14A-14B.

Referring collectively to FIGS. 14A & 14B, cooled electronic structure 1400 again includes an electronic component 510, such as described above with reference to the cooled electronic structures of FIGS. 5A-5D and 8A-8D. Heat sink 1401 is a multilayer heat sink with a heat sink base 1410, a membrane structure 1420, and a heat sink cap 1430, one embodiment of which is depicted in the cross-sectional plan view of FIG. 14B. Referring collectively to FIGS. 14A & 14B, heat sink base 1410 comprises one or more coolant-carrying channels 1412, each of which may comprise a microchannel structure, such as described above. In operation, heat from the electronic component is rejected to coolant within coolant-carrying channels 1412 in the heat sink base 1410, causing boiling of the coolant, that is, assuming higher heat flux operation.

Membrane 1420 is substantially identical to membrane 1320 described above with reference to FIGS. 13A-13E. One difference in this embodiment is the provision of a single, larger vapor-condensing channel (or chamber) 1432 within the heat sink cap 1430. Due to the flexible nature of membrane 1420, a mechanically stiff, larger-pore vapor-permeable support membrane (or plate) 1425 is also incorporated within the heat sink structure in order to facilitate maintaining membrane 1420 in relatively fixed position across the tops of the coolant-carrying channels 1412 in heat sink base 1410. A first fractional flow of liquid coolant is introduced through a coolant inlet manifold 1413 to the plurality of coolant-carrying channels 1412, and exhausted via a coolant exhaust manifold 1414. A first coolant flow is provided to coolant-carrying channels 1412 through a first coolant inlet port 1440 and a second coolant flow is provided to the vapor-condensing channels through a second coolant inlet port 1441, with the combined coolant exhaust being discharged via the coolant exhaust manifold 1414 through a coolant outlet port 1442. As with the above-described cooled electronic structure embodiments, heat sink base 1410 and heat sink cap 1430 are configured to accommodate an O-ring 1450 to seal coolant and vapor within the heat sink structure. Coolant and vapor are additionally sealed within the heat sink structure by providing a vapor and liquid impermeable region of the membrane around the periphery of the membrane, that is, where held by the heat sink base and the heat sink cap, as illustrated in FIG. 14A.

Note that in this embodiment, the mechanically stiff, larger-pore, vapor-permeable support membrane (or plate) resides atop and holds in place the more flexible vapor-permeable membrane, described above. Note also that, in an alternate embodiment, the vapor-permeable membrane 1420 may comprise the only vapor-permeable membrane separating the coolant-carrying channels and the vapor-condensing channel, provided that the membrane is sufficiently mechanically stiff to remain in position, or alternatively, is affixed over the tops of the coolant-carrying channels, for example, via epoxying the separation membrane to the heat sink base. FIG. 14A depicts a further alternative embodiment, wherein a mechanically stiff, larger-pore vapor-permeable support membrane structure overlies the more flexible vapor separation membrane 1420.

Advantageously, employing a single, larger vapor-condensing channel (or chamber) increases the cross-sectional flow area and reduces the pressure drop developed on the vent side of the heat sink due to flow of the condensing, sub-cooled liquid coolant and the vented vapor. Reducing the vent side pressure within the heat sink assists in driving more vapor across the separation membrane from the coolant-carrying channels to the vapor-condensing channel, and leads to better hydraulic and thermal performance of the cooling channels. Note that the secondary, mechanically stiff support membrane 1425 would also be, in one embodiment, hydrophobic (that is, assuming a water-based coolant), but since support membrane 1425 is not involved in vapor-liquid separation, membrane 1425 can have larger pores and a larger permeability, the latter leading to reduced hydraulic resistance for vapor flow.

Figure 15:
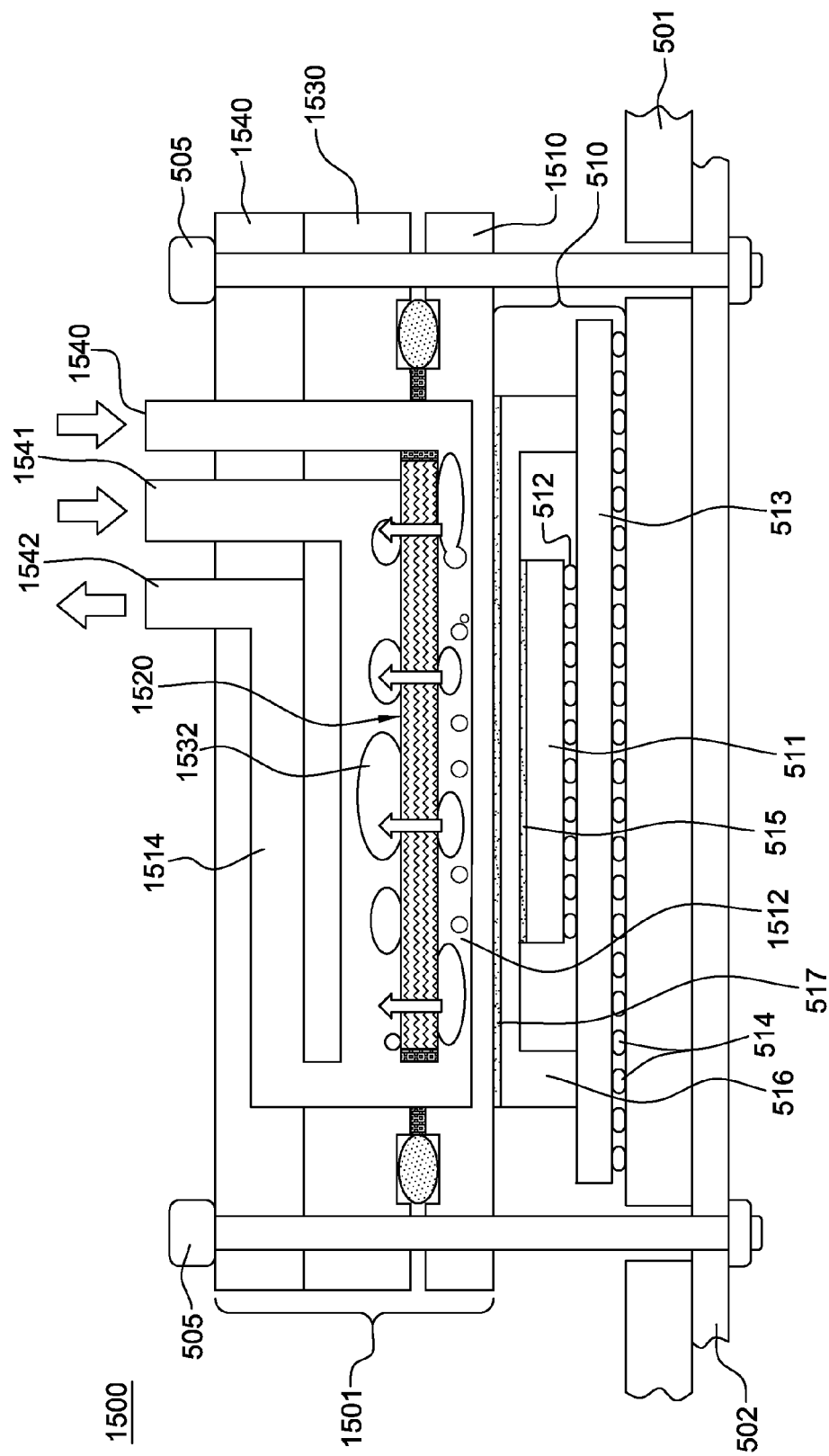
FIG. 15 is a cross-sectional elevational view of another embodiment of a cooled electronic structure, in accordance with one or more aspects of the present invention.

FIG. 15 illustrates another embodiment of a cooled electronic structure, generally denoted 1500, in accordance with one or more aspects of the present invention. Cooled electronic structure 1500 is similar to cooled electronic structure 1300 of FIGS. 13A-13E, as well as cooled electronic structure 1400 of FIGS. 14A-14B, except that a fourth heat sink layer 1540 is added in order to provide an extended coolant exhaust manifold 1514 to further facilitate condensing of vapor within the heat sink structure 1501 prior to discharge through coolant outlet port 1542. As in the above-described embodiments, cooled electronic structure 1500 includes an electronic component 510 mounted to a printed circuit board 501. Heat sink 1501 is mechanically coupled via securing mechanisms 505 to back plate 502 of printed circuit board 501, which provide compressive loading of heat sink 1501 to electronic component 510. Heat sink 1501 is a multilayer heat sink with a heat sink base 1510, a membrane structure 1520, a heat sink cap 1530, and a heat sink condensing cap structure 1540, configured to accommodate the extended coolant exhaust manifold 1514. As in the above-described embodiments, a first liquid coolant flow is introduced via a first coolant inlet port 1540, and a second liquid coolant flow is introduced via a second coolant inlet port 1541 to the respective coolant-carrying channels 1512 and vapor-condensing channels 1532. The heat sink base, heat sink cap and condensing cap structure may each comprise a metal material, such as copper, and the coolant flowing through the heat sink structure may comprise water, with the membrane being a porous hydrophobic material. The increased length of the extended coolant exhaust manifold 1514 facilitates ensuring that coolant exhausting from the heat sink structure is mostly liquid coolant, with little or no vapor phase. Note that in another embodiment, one or more additional heat sink layers could be added (above forth heat sink layer 1540) to further extend the length of the extended coolant exhaust manifold.

Figure 16A:
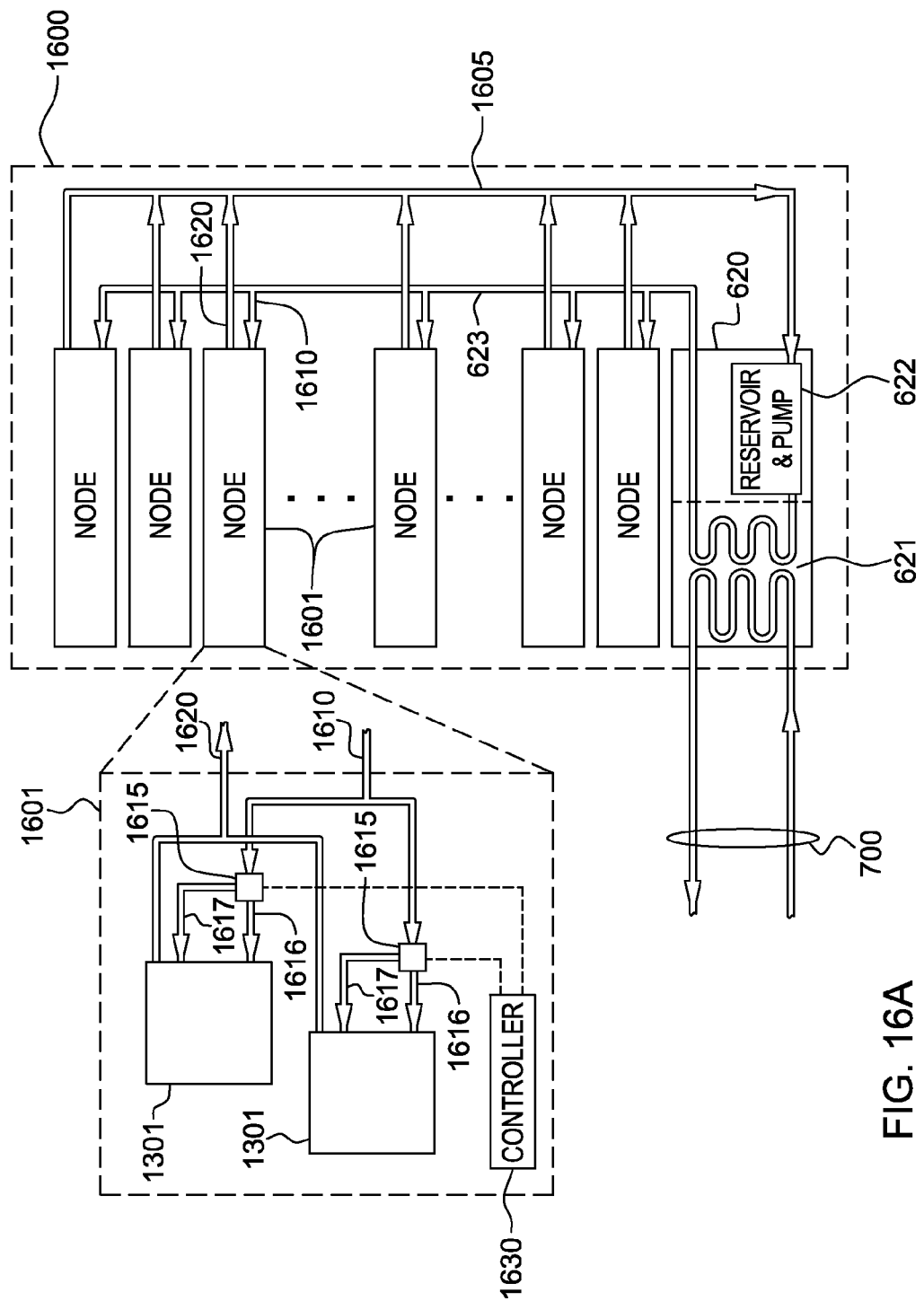
FIG. 16A is a schematic of one embodiment of a cooled electronic apparatus employing multiple heat sink structures to cool multiple heat-generating electronic components within nodes of a multi-node electronics rack, in accordance with one or more aspects of the present invention.

FIG. 16A depicts one embodiment of a rack-level cooling apparatus comprising multiple heat sink structures, such as depicted by way of example in FIGS. 13A-13E. Alternatively, the heat sink structures of FIGS. 14A-14B or FIG. 15 may be employed in the rack-level cooling apparatus of FIG. 16A.

In the embodiment of FIG. 16A, two heat sink structures 1301 are illustrated within an electronic subsystem (or node) 1601 of an electronics rack 1600. The cooling apparatus includes a modular cooling unit 620, such as described above. Modular cooling unit 620 includes a liquid-to-liquid heat exchanger 621 and a reservoir with an associated pump 622 for providing cooled liquid coolant via a coolant supply manifold 623 and node-level supply lines 610 to respective control valves 1615 at the coolant inlet ports of the respective heat sink structures 1301. As explained further below, a controller 1630 is coupled to control valve 1615 to dynamically adjust coolant flow through a first fractional coolant flow line 1616 and a second fractional coolant flow line 1617 to the coolant-carrying channels and vapor-condensing channels, respectively. Coolant exhausted from the heat sinks 1301 is combined at the node level and returned via a node-level return line 1620 to a coolant return manifold 1605 coupled to modular cooling unit 620, to repeat the process. In the depicted embodiment, liquid-to-liquid heat exchanger 621 is coupled to a facility coolant loop 700 providing chilled facility coolant to the heat exchanger for cooling the liquid coolant circulating within the multi-node electronics rack.

In the multiple node example depicted in FIG. 16A, controller 1630 is shown to reside within each node, however, in an alternate implementation, a single controller could be coupled to the control valves in multiple nodes of the electronics rack. The control valves can either be preset to split the coolant flow stream into a desired ratio, or be dynamically adjustable (for example, using electronic valves). Providing the ability to dynamically adjust the ratio as needed allows the vapor quality in the cooling channels of the heat sink to be controlled, and can facilitate providing a more uniform heat transfer coefficient and pressure drop as the thermal load of the electronic components vary. This would help reduce two-phase instabilities from forming in the electronics rack as different nodes experience different thermal loads. The warmed, single-phase liquid exiting the cooled electronic structures leaves the respective nodes and returns to the MCU, where the absorbed heat is rejected to the facility chilled coolant, such as water, and the cooled coolant (or working fluid) is subsequently pumped back to the nodes.

Figure 16B:
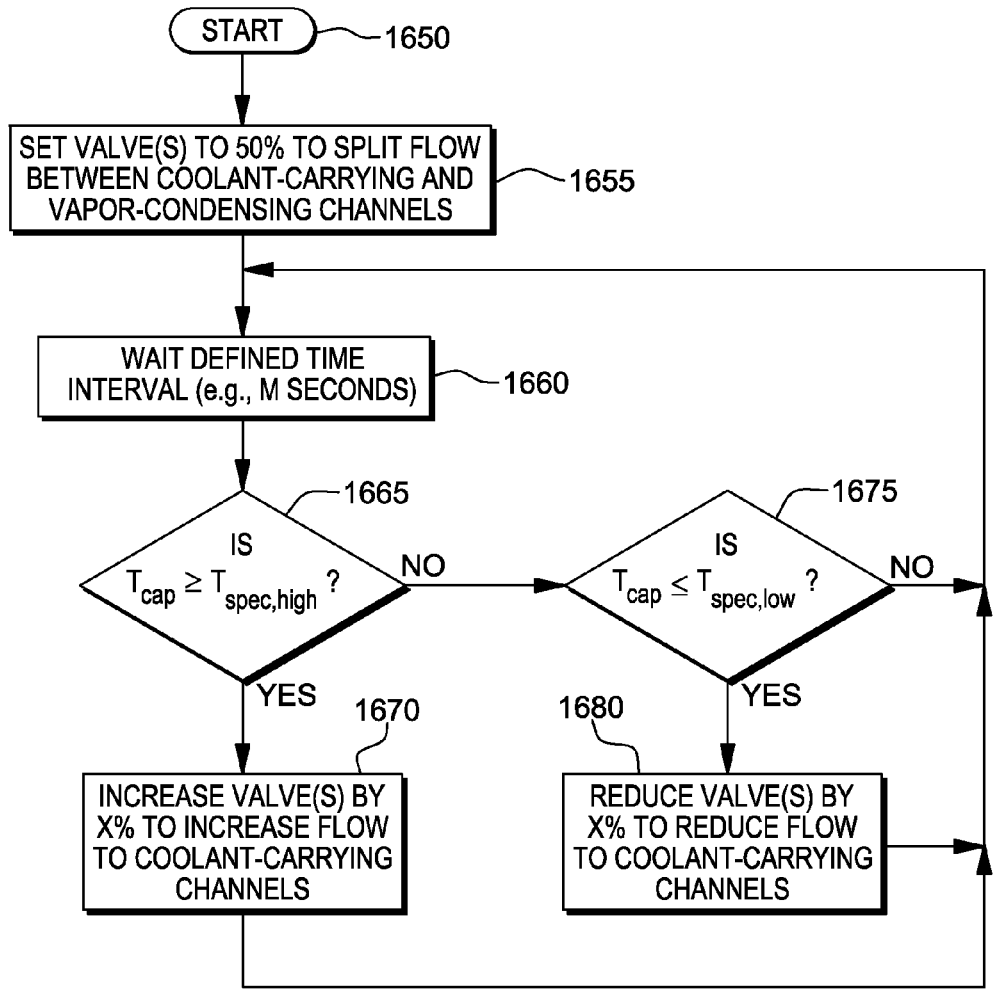
FIG. 16B depicts one embodiment of a control process for adjusting a first coolant flow and a second coolant flow provided to a respective heat sink structure, in accordance with one or more aspects of the present invention.

FIG. 16B depicts one embodiment of a control process for controlling a control valve in a dynamically adjustable control valve implementation such as depicted in FIG. 16A. Processing starts 1650 by setting (in one embodiment) the valve(s) to a 50% split of the coolant flow into the heat exchanger between the coolant-condensing channels and the vapor-condensing channels 1655. Processing waits a predefined time, such as M seconds 1660, before determining whether the temperature of the cap ($T_{cap}$) of the associated electronic component monitored by the controller is greater than a specified high temperature threshold $T_{spec, high}$ 1665. Note that this embodiment assumes that one or more temperature sensors are associated with the respective electronic component(s) of the associated cooled electronic structure, and that the sensed temperatures are fed back to the respective controller 1630. If "yes", then the valve is adjusted to increase (for example, by a set percentage (x %)) the coolant flow to the coolant-carrying channels in the heat sink base 1670 to provide greater cooling to the electronic component. Processing then waits the predefined time interval (e.g., M seconds) 1660 before again evaluating the cap temperature ($T_{cap}$). If the cap temperature ($T_{cap}$) is less than the specified high temperature threshold ($T_{spec, high}$), then processing determines whether the cap temperature ($T_{cap}$) is less than or equal to a specified low temperature threshold ($T_{spec, low}$) 1675. If "yes", then the control valve is automatically adjusted (for example, by the predefined percentage (x %)) to reduce the flow of coolant to the coolant-carrying channels in the heat sink base 1680. Thereafter, processing waits the defined time interval 1660 before repeating the process.

Figure 17:
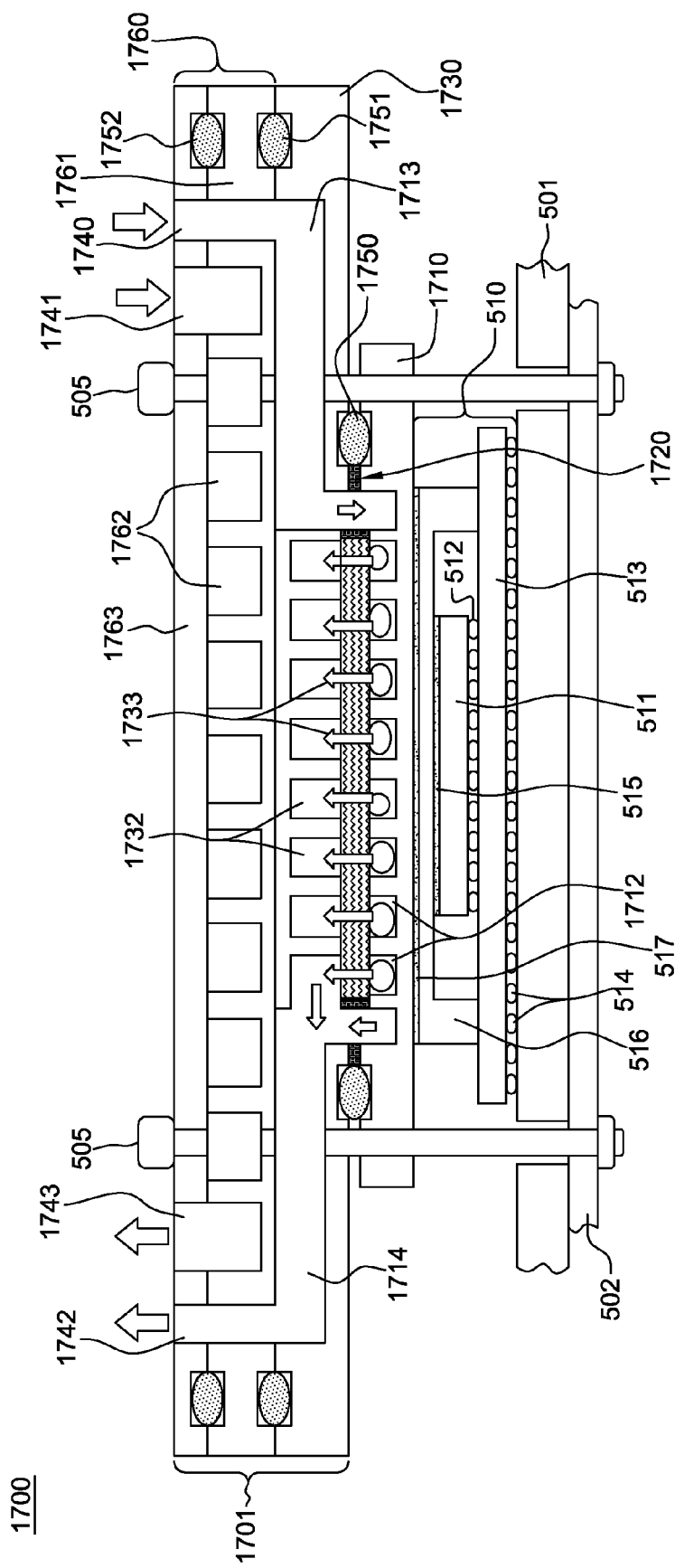
FIG. 17 is a cross-sectional plan view of another embodiment of a cooled electronic structure, in accordance with one or more aspects of the present invention.

FIG. 17 depicts another embodiment of a cooled electronic structure 1700, in accordance with one or more aspects of the present invention. Cooled electronic structure 1700 is similar to cooled electronic structure 500 of FIGS. 5A-5D, except that a condensing cap structure 1760 is added to the heat sink structure 1701, and the coolant inlet manifold 1713 and coolant outlet manifold 1714 are extended within the heat sink cap 1730 to accommodate a plurality of condensing coolant channels 1762 of condensing coolant cap 1760 being disposed over the vapor-condensing channels 1732 of heat sink cap 1730. Cooled electronic structure 1700 includes, in this embodiment, electronic component 510, such as an electronic module, mounted to printed circuit board 501, with an associated back plate 502. Heat sink 1701 is mechanically coupled via securing mechanisms 505 to back plate 502 of printed circuit board 501, which provide compressive loading of heat sink 1701 to electronic component 510.

Heat sink 1701 is a multilayer heat sink with a heat sink base 1710, a membrane structure 1720, and a heat sink cap 1730, such as the above-described heat sink base, membrane structure and heat sink cap of the embodiments of FIGS. 5A-15. As illustrated, heat sink base 1710 comprises one or more coolant-carrying channels 1712, each of which may comprise a microchannel structure, such as described above. Liquid coolant is provided via a coolant inlet manifold 1713 coupled in fluid communication with coolant inlet port 1740, and exhausted through a coolant exhaust manifold 1714 coupled in fluid communication with a coolant outlet port 1742. In operation, heat from the electronic component is rejected to coolant within the coolant-carrying channels 1712 in heat sink base 1710, causing boiling of the coolant. Membrane 1720 comprises a vapor-permeable region that overlies the tops of the coolant-carrying channels so as to provide localized venting of vapor 1733 directly from the coolant-carrying channels, across the vapor-permeable membrane into vapor-condensing channels 1732 of heat sink cap 1730.

In the embodiment of FIG. 17, condensing cap structure 1760 provides cooling of the vapor within the vapor-condensing channels 1732 in order to condense the vapor into a liquid coolant for exhausting through the coolant exhaust manifold 1714 of the heat sink structure 1701. As illustrated, a second coolant flow is received via a coolant inlet 1741 to condensing cap structure 1760. This second coolant flow may comprise, in one embodiment, a facility coolant flow, such as facility chilled water, which is passed through one or more condensing-coolant channels 1762 in condensing cap structure 1760. Condensing-coolant channels 1762 overlie, at least partially, the vapor-condensing channels 1732 in the heat sink cap for facilitating condensing of vapor 1733 passing across vapor-permeable membrane 1720 into the vapor-condensing channels. Liquid coolant is exhausted from condensing-coolant channels 1762 via an outlet port 1743. In the embodiment depicted, condensing coolant cap 1760 is a multilayer structure comprising a cap base 1761, comprising the plurality of condensing-coolant channels 1762, and a lid 1763 overlying the cap base 1761. As illustrated, the heat sink base 1710, heat sink cap 1730, condensing cap base 1761 and lid 1763 are configured to accommodate, in this embodiment, respective O-rings 1750, 1751 & 1752 to seal coolant and vapor within the heat sink 1701. As in the above embodiments, coolant and vapor may additionally be sealed within the heat sink by providing a vapor-impermeable region around the periphery of membrane 1720, that is, where held by the heat sink base 1710 and the heat sink cap 1730, as illustrated in FIG. 17.

Those skilled in the art will note that, in the embodiment of FIG. 17, all of the sub-cooled liquid coolant (or working fluid) is pumped directly into the coolant-carrying channels and allowed to vaporize, dependent on the heat load being extracted. The vapor formed escapes the confined mircrochannels, through the membrane, into the larger vapor-condensing channels. The vented vapor is at least partially condensed, and then mixed with the two-phase effluent at the exit of the coolant-carrying channels, and the resultant mixture further condenses as it flows in the heat sink structure, eventually leaving the heat sink as a warm, substantially single-phase fluid. In this embodiment, the condensing cap structure results in a two-fluid design, wherein a chilled facility coolant, such as a facility chilled water, enters the coolant-condensing channels of the condensing cap structure. The channels in the condensing cap structure are fabricated relatively large to avoid excessive pressure drop in the condensing cap structure.

Figure 18:
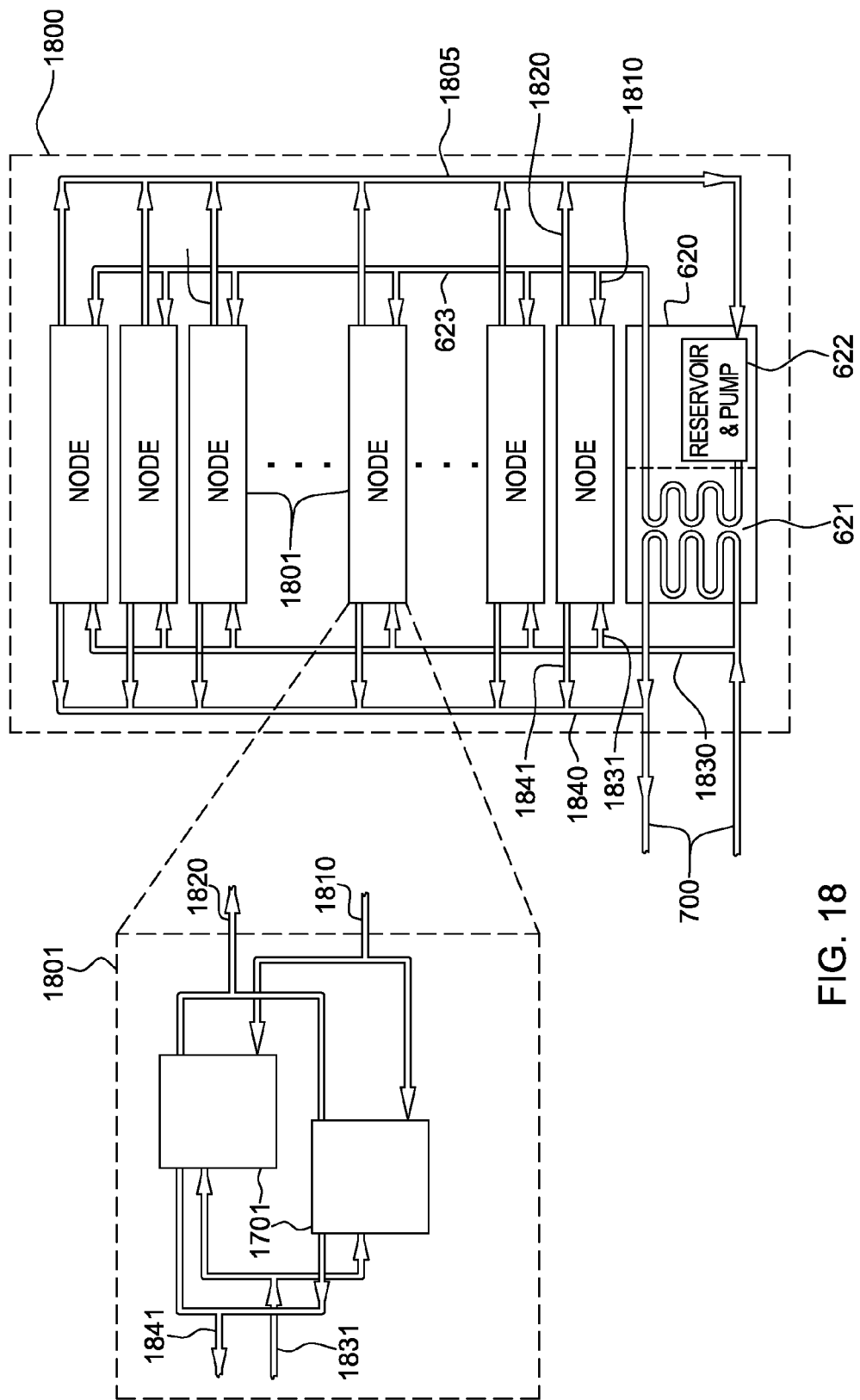
FIG. 18 is a schematic of another embodiment of a cooled electronic apparatus with multiple cooled electronic structures, such as depicted in FIG. 17, disposed in a node of a multi-node electronics rack, in accordance with one or more aspects of the present invention.

FIG. 18 depicts one embodiment of a rack-level cooling apparatus comprising multiple heat sink structures, such as heat sinks 1701 depicted in FIG. 17. In this embodiment, two heat sink structures 1701 are illustrated within an electronic subsystem 1801, such as a node of an electronics rack 1800. The cooling apparatus includes a modular cooling unit 620, such as described above. Modular cooling unit 620 includes a liquid-to-liquid heat exchanger 621 and a reservoir and an associated pump 622 for providing cooled liquid coolant via a coolant supply manifold 623 and node-level supply lines 1810 to the coolant inlet ports of the respective heat sinks 1701. In this embodiment, warmed coolant is exhausted via node-level return lines 1820 to a rack-level coolant return manifold 1805 coupled in fluid communication with the modular cooling unit 620. A facility coolant loop 700 provides facility coolant to liquid-to-liquid heat exchanger 621, as well as to a facility coolant supply manifold 1830 for provision, via node-level facility supply lines 1831, to the condensing cap structures (described above) of the heat sinks 1701. Node-level facility return lines 1841 exhaust the facility coolant from the respective heat sinks to a facility coolant return manifold 1840 for return via the facility coolant loop 700.

In operation, warm, single-phase fluid (or coolant) leaves the respective nodes of the electronics rack and is cooled through the heat exchange in the modular cooling unit with the chilled facility coolant, before being pumped back to the nodes. In addition to receiving heat at the MCU, the chilled facility coolant is also pumped to the nodes, where it is distributed among the condensing cap structures to help condense the vapor within the respective heat sinks Note that this implementation advantageously requires a smaller coolant flow, and provides a reduced pressure drop, since all of the coolant used is for direct cooling of the electronic component, rather than being split apart, to cool both the electronic component and to condense the vapor produced, as in the case of a single-fluid approach, such as described above with respect to FIGS. 13A-16B.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A heat sink comprising:
   a thermally conductive structure comprising at least one coolant-carrying channel and at least one vapor-condensing channel;
   a membrane disposed between the at least one coolant-carrying channel and the at least one vapor-condensing channel, the membrane comprising at least one vapor-permeable region, at least a portion of the at least one vapor-permeable region overlying a portion of the at least one coolant-carrying channel and facilitating removal of vapor from the at last one coolant-carrying channel to the at least one vapor-condensing channel; and
   at least one coolant inlet coupled to provide a first coolant flow to the at least one coolant-carrying channel, and a second coolant flow to condense vapor within the at least one vapor-condensing channel.

2. The heat sink of claim 1, wherein the membrane is a liquid-impermeable membrane and the at least one coolant-carrying channel comprises at least one coolant-carrying microchannel having a characteristic dimension less than 1.0 mm.

3. The heat sink of claim 1, wherein the heat sink is coupled to a cooling system comprising a coolant loop, the coolant loop providing a cooled coolant flow to the heat sink, and wherein the first coolant flow is a first fractional flow of the cooled coolant flow and the second coolant flow is a second fractional flow of the cooled coolant flow.

4. The heat sink of claim 3, further comprising at least one adjustable flow valve adjustable to dynamically adjust the first fractional flow through the at least one coolant-carrying channel and the second fractional flow to condense the vapor in the at least one vapor-condensing channel.

5. The heat sink of claim 4, wherein the second coolant flow is provided to the at least one vapor-condensing channel, and wherein the at least one vapor-condensing channel has a larger hydraulic diameter than the at least one coolant-carrying channel.

6. The heat sink of claim 1, further comprising at least one coolant exhaust channel in fluid communication with the at least one coolant-carrying, channel and the at least one vapor-condensing channel and facilitating exhausting of coolant from the at least one coolant-carrying channel and the at least one vapor-condensing channel, and an outlet port in fluid communication with the at least one coolant exhaust channel and facilitating exhausting of coolant from the at least one coolant exhaust channel.

7. The heat sink of claim 6, wherein the heat sink comprises a multilayer structure, the multilayer structure comprising a first layer comprising the at least one coolant-carrying channel, a second layer comprising the membrane, a third layer comprising the at least one vapor-condensing channel, and a fourth layer comprising at least a portion of the at least one coolant exhaust channel.

8. The heat sink of claim 7, wherein the portion of the at least one coolant exhaust channel in the fourth layer is at least partially disposed parallel to the at least one vapor-condensing channel in the third layer and the at least one coolant-carrying channel in the first layer.

9. The heat sink of claim 1, further comprising a vapor-permeable support structure associated with the membrane and disposed between the membrane and the at least one vapor-condensing channel, and wherein the at least one vapor-condensing channel comprises a vapor-condensing chamber having a larger hydraulic diameter than the at least one coolant-carrying channel.

10. The heat sink of claim 1, further comprising a condensing cap structure comprising at least one condensing coolant channel overlying the at least one vapor-condensing channel, and wherein the heat sink comprises a first coolant inlet providing the first coolant flow to the at least one coolant-carrying channel, and a second coolant inlet providing the second coolant flow to the at least one condensing coolant channel of the condensing cap structure.

11. The heat sink of claim 10, wherein the first coolant inlet and the second coolant inlet are coupled in fluid communication with different coolant loops disposed external to the heat sink.

12. A cooled electronic apparatus comprising:
   an electronics rack comprising at least one heat-generating electronic component to be cooled; and
   a cooling apparatus for cooling the at least one heat-generating electronic component, the cooling apparatus comprising:
      at least one heat sink, the at least one heat sink being coupled to the at least one heat-generating electronic component, and comprising:
         a thermally conductive structure comprising at least one coolant-carrying channel and at least one vapor-condensing channel;
         a membrane disposed between the at least one coolant-carrying channel and the at least one vapor-condensing channel, the membrane comprising at least one vapor-permeable region, at least a portion of the at least one vapor-permeable region overlying a portion of the at least one coolant-carrying channel and facilitating removal of vapor from the at least one coolant-carrying channel to the at least one vapor-condensing channel; and
         at least one coolant inlet coupled to provide a first coolant flow to the at least one coolant-carrying channel and a second coolant flow to condense vapor within the at least one vapor-condensing channel.

13. The cooled electronic apparatus of claim 12, wherein the cooling apparatus further comprises a coolant loop comprising a cooled coolant flow, and wherein the first coolant flow is a first fractional flow of the cooled coolant flow and the second coolant flow is a second fractional flow of the cooled coolant flow.

14. The cooled electronic apparatus of claim 13, wherein the cooling apparatus further comprises at least one adjustable flow valve coupled in fluid communication with the coolant loop, the at least one adjustable flow valve being adjustable to dynamically adjust the first fractional flow through the at least one coolant-carrying channel, and the second fractional flow to condense the vapor in the at least one vapor-condensing channel, and wherein the at least one adjustable flow valve is controlled to dynamically adjust the first fractional flow and the second fractional flow with reference to a temperature associated with the at least one heat-generating electronic component.

15. The cooled electronic apparatus of claim 12, wherein the at least one heat sink further comprises at least one coolant exhaust channel in fluid communication with the at least one coolant-carrying channel and the at least one vapor-condensing channel and facilitating exhausting of coolant from the at least one coolant-carrying channel and the at least one vapor-condensing channel, and an outlet port in fluid communication with the at least one coolant exhaust channel and facilitating exhausting of coolant from the at least one coolant exhaust channel.

16. The cooled electronic apparatus of claim 15, wherein the at least one heat sink comprises a multilayer structure, the multilayer structure comprising a first layer comprising the at least one coolant-carrying channel, a second layer comprising the membrane, a third layer comprising the at least one vapor-condensing channel, and a fourth layer comprising at least portion of the at least one coolant exhaust channel.

17. The cooled electronic apparatus of claim 12, wherein the at least one heat sink further comprises a vapor-permeable support structure associated with the membrane and disposed between the membrane and the at least one vapor-condensing channel, and wherein the at least one vapor-condensing channel comprises a vapor-condensing chamber having a larger hydraulic diameter than the at least one coolant-carrying channel.

18. The cooled electronic apparatus of claim 12, wherein the at least one heat sink further comprises a condensing cap structure comprising at least one condensing coolant channel overlying the at least one vapor-condensing channel, and wherein the at least one heat sink comprises a first coolant inlet providing the first coolant flow to the at least one coolant-carrying channel and a second coolant inlet providing the second coolant flow to the at least one condensing coolant channel of the condensing cap structure.

19. The cooled electronic apparatus of claim 18, wherein the cooling apparatus further comprises a system coolant loop and a facility coolant loop, and wherein the first coolant inlet is in fluid communication with the system coolant loop and the second coolant inlet is in fluid communication with the facility coolant loop.

* * * * *